(12) United States Patent
Loncke et al.

(10) Patent No.: US 10,312,937 B2
(45) Date of Patent: Jun. 4, 2019

(54) EARLY TERMINATION TECHNIQUE FOR LDPC DECODER ARCHITECTURE

(71) Applicant: QUALCOMM Incorporated, San Diego, CA (US)

(72) Inventors: Vincent Loncke, Piscataway, NJ (US); Yi Cao, Parsippany, NJ (US); Girish Varatkar, Hillsborough, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 8 days.

(21) Appl. No.: 15/619,168

(22) Filed: Jun. 9, 2017

(65) Prior Publication Data

US 2018/0123614 A1   May 3, 2018

Related U.S. Application Data

(60) Provisional application No. 62/416,591, filed on Nov. 2, 2016.

(51) Int. Cl.
*H03M 13/11* (2006.01)
*H04L 1/00* (2006.01)

(52) U.S. Cl.
CPC ...... *H03M 13/1125* (2013.01); *H03M 13/114* (2013.01); *H03M 13/1108* (2013.01); *H03M 13/1128* (2013.01); *H04L 1/0051* (2013.01); *H04L 1/0054* (2013.01); *H04L 1/0057* (2013.01)

(58) Field of Classification Search
CPC .................................................. H03M 13/11
USPC ........................................ 714/758, 759, 761
See application file for complete search history.

(56) References Cited

U.S. PATENT DOCUMENTS

| | | | |
|---|---|---|---|
| 8,219,878 B1* | 7/2012 | Varnica | H03M 13/1142 714/758 |
| 2008/0307292 A1* | 12/2008 | Gaudet | H03M 13/1131 714/786 |
| 2011/0252286 A1 | 10/2011 | Li et al. | |
| 2011/0289382 A1 | 11/2011 | Shih et al. | |
| 2012/0054576 A1* | 3/2012 | Gross | H03M 13/1117 714/752 |
| 2013/0007554 A1 | 1/2013 | Chen et al. | |
| 2013/0031447 A1* | 1/2013 | Sharon | H03M 13/1128 714/785 |
| 2013/0073928 A1* | 3/2013 | Anholt | H03M 13/1111 714/781 |
| 2014/0223255 A1 | 8/2014 | Lu et al. | |

(Continued)

FOREIGN PATENT DOCUMENTS

WO    2009053940 A2    4/2009

OTHER PUBLICATIONS

Hocevar D.E., "A Reduced Complexity Decoder Architecture via Layered Decoding of LDPC Codes", Proc., IEEE Workshop on Signal Processing Systems, SIPS 2004, Oct. 13, 2004 (Oct. 13, 2004)-Oct. 15, 2004 (Oct. 15, 2004), XP010743944, pp. 107-112.

(Continued)

*Primary Examiner* — Fritz Alphonse
(74) *Attorney, Agent, or Firm* — Patterson & Sheridan, LLP

(57) ABSTRACT

Certain aspects of the present disclosure generally relate to methods and apparatus for decoding low density parity check (LDPC) codes, and more particularly to early termination techniques for low-density parity-check (LDPC) decoder architecture.

20 Claims, 17 Drawing Sheets

(56) References Cited

U.S. PATENT DOCUMENTS

2015/0207523 A1 7/2015 Abu-Surra et al.
2016/0301425 A1 10/2016 Morero et al.

OTHER PUBLICATIONS

International Search Report and Written Opinion—PCT/US2017/056789—ISA/EPO—dated Jan. 25, 2018.

* cited by examiner

Bit Columns

| Parity Check Rows | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| 0 | 48 | 29 | 28 | 39 | 9 | 61 | - | - | - | 63 | 45 | 80 | - | - | - | 37 | 32 | 22 | 1 | 0 | - | - | - | - |
| 1 | 4 | 49 | 42 | 48 | 11 | 30 | - | - | - | 49 | 17 | 41 | 37 | 15 | 7 | 54 | - | - | - | 0 | 0 | - | - | - |
| 2 | 35 | 76 | 78 | 51 | 37 | 35 | 21 | 17 | - | 64 | - | - | - | 59 | - | - | - | 32 | 0 | - | 0 | 0 | - | - |
| 3 | 9 | 65 | 44 | 9 | 54 | 56 | 73 | 34 | 42 | - | - | - | 35 | - | - | - | 46 | 39 | - | - | - | 0 | 0 | - |
| 4 | 3 | 62 | 7 | 80 | 68 | 26 | - | 80 | 55 | - | 36 | - | 26 | - | 9 | - | 72 | - | - | - | - | - | 0 | 0 |
| 5 | 26 | 75 | 33 | 21 | 69 | 59 | 3 | 38 | - | - | - | 35 | - | 62 | 36 | 26 | - | - | 1 | - | - | - | - | 0 |

FIG. 10

|   |   | 0 | 1 | 2 | 3 | 4 | 5 |
|---|---|---|---|---|---|---|---|
| Row 4 |  | 1 | 0 | 1 | 1 | 0 | 0 |
| Row 5 |  | 1 | 1 | 0 | 0 | 0 | 1 |

| Cycle | Equation (6) | | Equation (10) |
|---|---|---|---|
| 0 | $L(q_{40}) = L(q_0) - R_{40old}$ | | |
| 1 | $L(q_{42}) = L(q_2) - R_{42old}$ | | |
| 2 | $L(q_{43}) = L(q_3) - R_{43old}$ | | |
| 3 | $L(q_{50}) = L(q_{40}) - R_{50old}$ | | $L(q_0) = L(q_{40}) + R_{40new}$ |
| 4 | $\begin{pmatrix} L(q_{51}) = L(q_1) - R_{51old} \\ L(q_{55}) = L(q_5) - R_{55old} \end{pmatrix}$ | | $\begin{pmatrix} L(q_2) = L(q_{42}) + R_{42new} \\ L(q_3) = L(q_{43}) + R_{43new} \\ L(q_0) = L(q_{50}) + R_{50new} \\ L(q_1) = L(q_{51}) + R_{51new} \\ L(q_5) = L(q_{55}) + R_{55new} \end{pmatrix}$ |

Equation (15)

$L(q_0) = L(q_0) + R_{40new} - R_{40old}$ $L(q_2) = L(q_2) + R_{42new} - R_{42old}$ $L(q_3) = L(q_3) + R_{43new} - R_{43old}$ $L(q_0) = L(q_0) + R_{50new} - R_{50old}$ $L(q_1) = L(q_1) + R_{51new} - R_{51old}$ $L(q_5) = L(q_5) + R_{55new} - R_{55old}$

Equation (11)

| Cycle | Equation (11) |
|---|---|
| 0 | $L(q_{40}) = \ldots - R_{40old}$ |
| 1 | $L(q_{42}) = \ldots - R_{42old}$ |
| 2 | $L(q_{43}) = \ldots - R_{43old}$ |
| 3 | $L(q_{55}) = \ldots - R_{55old}$ |
| 4 | $L(q_{51}) = \ldots - R_{51old}$ |
| 5 | $L(q_{50}) = L(q_0) \ldots - R_{50old}$ — Uses latest $L(q_0)$ upate |

FIG. 17

Layered LDPC Pipeline (Dual memory banks to resolve read conflicts)

EARLY TERMINATION TECHNIQUE FOR LDPC DECODER ARCHITECTURE

CROSS-REFERENCE TO RELATED APPLICATIONS

This application claims the benefit of U.S. Provisional Patent No. 62/416,591, filed Nov. 2, 2016. The content of the provisional application is hereby incorporated by reference in its entirety.

INTRODUCTION

Certain aspects of the present disclosure generally relate to methods and apparatus for wireless communications, and more particularly to early termination techniques for low-density parity-check (LDPC) decoder architecture.

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Long Term Evolution (LTE) systems, Code Division Multiple Access (CDMA) systems, Time Division Multiple Access (TDMA) systems, Frequency Division Multiple Access (FDMA) systems, $3^{rd}$ Generation Partnership Project (3GPP) Long Term Evolution (LTE) systems, Long Term Evolution Advanced (LTE-A) systems, and Orthogonal Frequency Division Multiple Access (OFDMA) systems.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a one may be changed to a zero or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a one or a zero) together with some indication of the reliability of that estimate. While the number of errors may be relatively low, even a small number of errors or level of distortion can result in the data being unusable or, in the case of transmission errors, may necessitate retransmission of the data.

In order to provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

With the increased use of fiber optic lines for data communication and increases in the rate at which data can be read from and stored to data storage devices, (e.g., disk drives, tapes, etc.), there is an increasing need not only for efficient use of data storage and transmission capacity but also for the ability to encode and decode data at high rates of speed.

While encoding efficiency and high data rates are important, for an encoding and/or decoding system to be practical for use in a wide range of devices (e.g., consumer devices), it is important that the encoders and/or decoders be capable of being implemented at reasonable cost.

Communication systems often need to operate at several different rates. One way to keep the implementation as simple as possible and to provide for the coding and decoding at the different rates is to use adjustable low-density-parity check (LDPC) codes. In particular, one can generate higher-rate LDPC codes by puncturing lower-rate codes.

These multiple access technologies have been adopted in various telecommunication standards to provide a common protocol that enables different wireless devices to communicate on a municipal, national, regional, and even global level. An example of an emerging telecommunication standard is new radio (NR). NR is a set of enhancements to the LTE mobile standard (e.g., 5G radio access) promulgated by Third Generation Partnership Project (3GPP). NR is designed to better support mobile broadband Internet access by improving spectral efficiency, lower costs, improve services, make use of new spectrum, and better integrate with other open standards using OFDMA with a cyclic prefix (CP) on the downlink (DL) and on the uplink (UL) as well as support beamforming, multiple-input multiple-output (MIMO) antenna technology, and carrier aggregation.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

BRIEF SUMMARY

The systems, methods, and devices of the disclosure each have several aspects, no single one of which is solely responsible for its desirable attributes. Without limiting the scope of this disclosure as expressed by the claims, which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure present a method for performing low-density parity-check (LDPC) decoding. An exemplary method generally includes receiving log-likelihood ratios (LLRs) corresponding to bits encoded using LDPC encoding. The method further includes updating the LLRs corresponding to the encoded bits corresponding to columns of a parity check matrix (PCM). The LLRs indicate a probability of a value of each of the encoded bits. Each row of the PCM corresponds to a parity check for the encoded bits. The method further includes iteratively decoding the encoded bits using the PCM. For each iteration of decoding, for each row of the PCM, the LLRs are updated based on a processing of the row of the PCM. The method further includes maintaining an overall parity bit. The method further includes setting the overall parity bit to true at a beginning of an iteration of decoding. The method further includes for each processing of the row of the PCM, adding a result of the parity check for the LLRs to the overall parity bit during the iteration of decoding. The method further includes maintaining a sign flip bit. The method further includes setting the sign flip bit to true at the beginning of the iteration of decoding. The method further includes setting the sign flip bit to false when a sign of any LLR changes during the iteration of decoding. The method further includes stopping iteratively decoding the encoded bits when the sign flip bit and the overall parity bit are set to true at an end of the iteration of decoding.

Certain aspects of the present disclosure present an apparatus for performing low-density parity-check (LDPC) decoding. An exemplary apparatus generally includes means for receiving log-likelihood ratios (LLRs) corresponding to bits encoded using LDPC encoding. The apparatus further includes means for updating the LLRs corresponding to the encoded bits corresponding to columns of a parity check matrix (PCM). The LLRs indicate a probability of a value of each of the encoded bits. Each row of the PCM corresponds to a parity check for the encoded bits. The apparatus further includes means for iteratively decoding the encoded bits using the PCM. For each iteration of decoding, for each row of the PCM, the LLRs are updated based on a processing of the row of the PCM. The apparatus further includes means for maintaining an overall parity bit. The apparatus further includes means for setting the overall parity bit to true at a beginning of an iteration of decoding. The apparatus further includes means for, for each processing of the row of the PCM, adding a result of the parity check for the LLRs to the overall parity bit during the iteration of decoding. The apparatus further includes means for maintaining a sign flip bit. The apparatus further includes means for setting the sign flip bit to true at the beginning of the iteration of decoding. The apparatus further includes means for setting the sign flip bit to false when a sign of any LLR changes during the iteration of decoding. The apparatus further includes means for stopping iteratively decoding the encoded bits when the sign flip bit and the overall parity bit are set to true at an end of the iteration of decoding.

Certain aspects of the present disclosure present an apparatus for performing low-density parity-check (LDPC) decoding. An exemplary apparatus generally includes a memory and a processor. The memory and processor are configured to receive log-likelihood ratios (LLRs) corresponding to bits encoded using LDPC encoding. The memory and processor are further configured to update the LLRs corresponding to the encoded bits corresponding to columns of a parity check matrix (PCM). The LLRs indicate a probability of a value of each of the encoded bits. Each row of the PCM corresponds to a parity check for the encoded bits. The memory and processor are further configured to iteratively decode the encoded bits using the PCM. For each iteration of decoding, for each row of the PCM, the LLRs are updated based on a processing of the row of the PCM. The memory and processor are further configured to maintain an overall parity bit. The memory and processor are further configured to set the overall parity bit to true at a beginning of an iteration of decoding. The memory and processor are further configured to, for each processing of the row of the PCM, add a result of the parity check for the LLRs to the overall parity bit during the iteration of decoding. The memory and processor are further configured to maintain a sign flip bit. The memory and processor are further configured to set the sign flip bit to true at the beginning of the iteration of decoding. The memory and processor are further configured to set the sign flip bit to false when a sign of any LLR changes during the iteration of decoding. The memory and processor are further configured to stop iteratively decoding the encoded bits when the sign flip bit and the overall parity bit are set to true at an end of the iteration of decoding.

Certain aspects of the present disclosure present a computer readable medium having instructions stored thereon for performing a method for performing low-density parity-check (LDPC) decoding. An exemplary method generally includes receiving log-likelihood ratios (LLRs) corresponding to bits encoded using LDPC encoding. The method further includes updating the LLRs corresponding to the encoded bits corresponding to columns of a parity check matrix (PCM). The LLRs indicate a probability of a value of each of the encoded bits. Each row of the PCM corresponds to a parity check for the encoded bits. The method further includes iteratively decoding the encoded bits using the PCM. For each iteration of decoding, for each row of the PCM, the LLRs are updated based on a processing of the row of the PCM. The method further includes maintaining an overall parity bit. The method further includes setting the overall parity bit to true at a beginning of an iteration of decoding. The method further includes for each processing of the row of the PCM, adding a result of the parity check for the LLRs to the overall parity bit during the iteration of decoding. The method further includes maintaining a sign flip bit. The method further includes setting the sign flip bit to true at the beginning of the iteration of decoding. The method further includes setting the sign flip bit to false when a sign of any LLR changes during the iteration of decoding. The method further includes stopping iteratively decoding the encoded bits when the sign flip bit and the overall parity bit are set to true at an end of the iteration of decoding.

Other aspects and features of the present disclosure will become apparent to those of ordinary skill in the art, upon reviewing the following description of specific, exemplary aspects of the present disclosure in conjunction with the accompanying figures. While features of the present disclosure may be discussed relative to certain aspects and figures below, all aspects of the present disclosure can include one or more of the advantageous features discussed herein. In other words, while one or more aspects may be discussed as having certain advantageous features, one or more of such features may also be used in accordance with the various aspects of the disclosure discussed herein. In similar fashion, while exemplary aspects may be discussed below as device, system, or method aspects it should be understood that such exemplary aspects can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

FIG. 10 illustrates an example of a process for computing/updating bit log-likelihood ratios (LLRs) and a posteriori LLRs in a parity check matrix, according to certain aspects of the present disclosure.

FIG. 17 illustrates an exemplary solution for increasing the memory bandwidth to accommodate the processing and updating of LLRs, according to aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
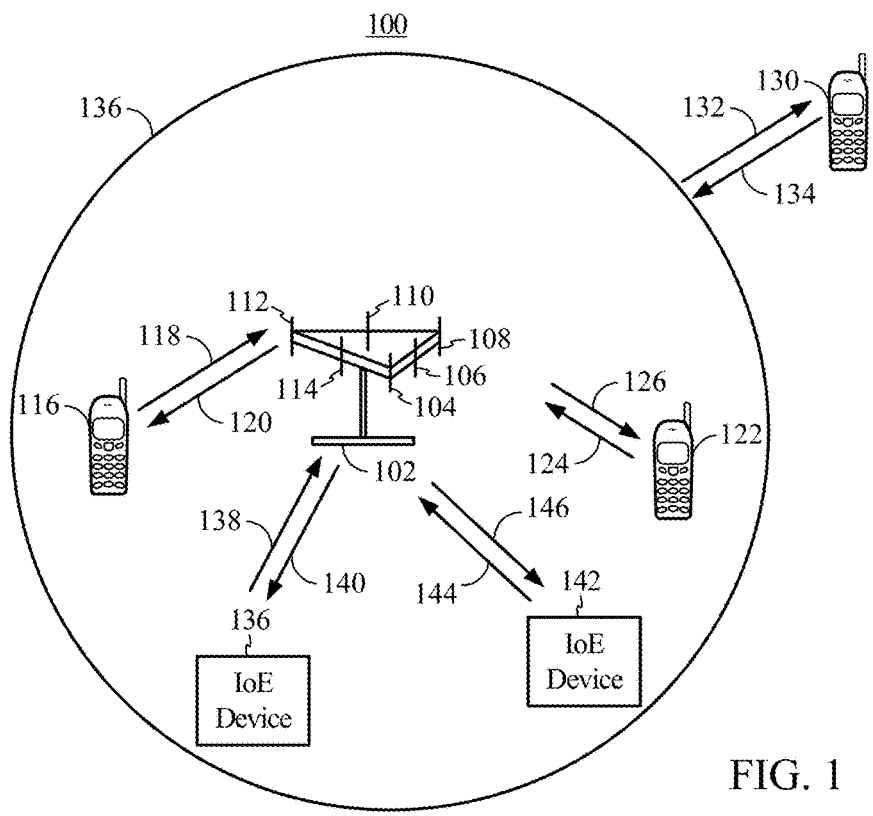
FIG. 1 illustrates an example multiple access wireless communication system, according to certain aspects of the present disclosure.

Aspects of the present disclosure provide apparatus, methods, processing systems, and computer program products for encoding for new radio (NR) (new radio access technology). New radio (NR) may refer to radios configured to operate according to a new air interface or fixed transport layer. NR may include Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and mission critical targeting ultra reliable low latency communications (URLLC). For these general topics, different techniques are considered, such as coding, low-density parity check (LDPC), and polar. NR cell may refer to a cell operating according to the new air interface or fixed transport layer. A NR Node B (e.g., 5G Node B) may correspond to one or multiple transmission reception points (TRPs).

Certain aspects of the present disclosure generally relate to methods and apparatus for decoding low density parity check (LDPC) codes, and more particularly to early termination techniques for LDPC decoders. For example, aspects of the present disclosure present techniques that determine when to terminate LDPC decoding. In some aspects, though certain early termination techniques are described herein as applied to layered LDPC decoders, including specific layered LDPC decoders described herein, such early termination techniques may also be applied to other suitable layered LDPC decoders, or even other suitable LDPC decoders.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Long Term Evolution (LTE), Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as NR (e.g., 5G RA), Evolved UTRA (E-UTRA), IEEE 802.11, IEEE 802.16, IEEE 802.20, Flash-OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). NR is an emerging wireless communications technology under development in conjunction with the 5G Technology Forum (5GTF). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn great attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Node B (e.g., 5G Node B), transmission reception point (TRP), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), medical devices or equipment, biometric sensors/devices, an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link.

While aspects may be described herein using terminology commonly associated with 3G and/or 4G wireless technologies, aspects of the present disclosure can be applied in other generation-based communication systems, such as 5G and later, including NR technologies.

An Example Wireless Communication System

FIG. 1 illustrates an example communications network 100 in which aspects of the present disclosure may be performed. As illustrated, a Node B 102 (e.g., a TRP or 5G Node B) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Wireless node 116 may be in communication with antennas 112 and 114, where antennas 112 and 114 transmit information to wireless node 116 over forward link 120 and receive information from wireless node 116 over reverse link 118. Wireless node 122 may be in communication with antennas 106 and 108, where antennas 106 and 108 transmit information to wireless node 122 over forward link 126 and receive information from wireless node 122 over reverse link 124. The Node B 102 may also be in communication with other wireless nodes, which may be, for example, Internet-of-Everything (IoE) devices. IoE device 136 may be in communication with one or more other antennas of Node B 102, where the antennas transmit information to IoE device 136 over forward link 140 and receive information from IoE device 136 over reverse link 138. IoE device 142 may be in communication with one or more other antennas of Node B 102, where the antennas transmit information to IoE device 142 over forward link 146 and receive information from IoE device 142 over reverse link 144. In a Frequency Division Duplex (FDD) system, communication links 118, 120, 124, 126, 138, 140, 144, and 146 may use different frequency for communication. For example, forward link 120 may use a different frequency than that used by reverse link 118, and forward link 140 may use a different frequency than that used by reverse link 138.

Each group of antennas and/or the area in which they are designed to communicate is often referred to as a sector of the Node B. In one aspect of the present disclosure, each antenna group may be designed to communicate to wireless nodes in a sector of the areas covered by Node B 102.

Wireless node 130 may be in communication with Node B 102, where antennas from the Node B 102 transmit information to wireless node 130 over forward link 132 and receive information from the wireless node 130 over reverse link 134.

In communication over forward links 120 and 126, the transmitting antennas of BS 102 may utilize beamforming in order to improve the signal-to-noise ratio of forward links for the different wireless nodes 116, 122, 136, and 142. Also, a Node B using beamforming to transmit to wireless nodes scattered randomly through its coverage causes less interference to wireless nodes in neighboring cells than a Node B transmitting through a single antenna to all its wireless nodes.

While aspects of the examples described herein may be associated with LTE technologies, aspects of the present disclosure may be applicable with other wireless communications systems, such as NR. NR may utilize orthogonal frequency-division multiplexing (OFDM) with a CP on the uplink and downlink and include support for half-duplex operation using time division duplex (TDD). A single component carrier bandwidth of 100 MHZ may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., downlink (DL) or uplink (UL)) for data transmission and the link direction for each subframe may be dynamically switched. Each subframe may include DL/UL data as well as DL/UL control data. Beamforming may be supported and beam direction may be dynamically configured. MIMO transmissions with precoding may also be supported. MIMO configurations in the DL may support up to 8 transmit antennas with multi-layer DL transmissions with up to 8 streams. Multi-layer transmissions with up to 2 streams per UE may be supported. Aggregation of multiple cells may be supported with up to 8 serving cells. Alternatively, NR may support a different air interface, other than an OFDM-based air interface. NR networks may include entities such central units or distributed units.

Figure 2:
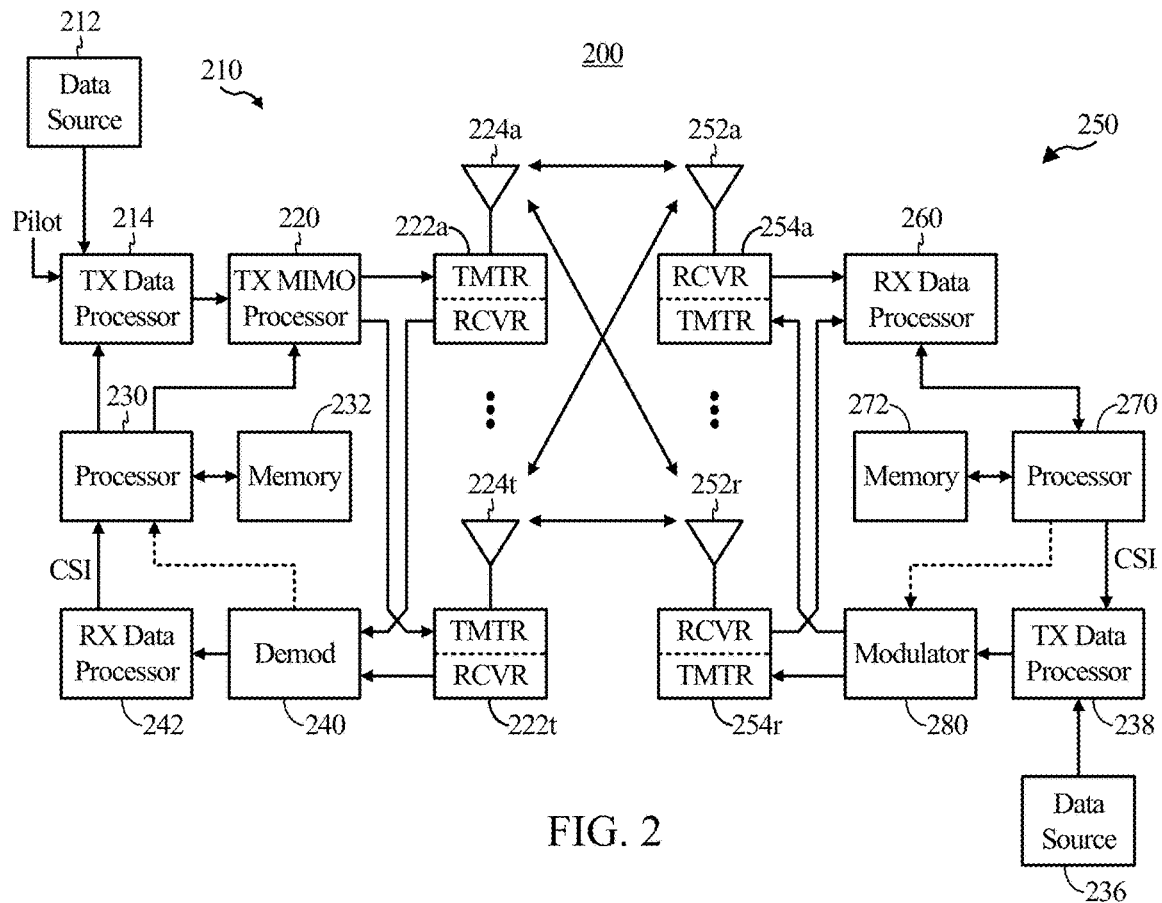
FIG. 2 illustrates a block diagram of a base station and a wireless node, according to certain aspects of the present disclosure.

FIG. 2 illustrates a block diagram of an aspect of a transmitter system 210 (e.g., also known as the base station) and a receiver system 250 (e.g., also known as the wireless node) in a multiple-input multiple-output (MIMO) system 200, in which aspects of the present disclosure may be practiced. Each of system 210 and system 250 has capabilities to both transmit and receive. Whether system 210 or system 250 is transmitting, receiving, or transmitting and receiving simultaneously depends on the application. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme (e.g., low-density parity check (LDPC)) selected for that data stream to provide coded data.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (e.g., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230. Memory 232 may store data and software/firmware for the transmitter system 210.

The modulation symbols for all data streams are then provided to a TX MIMO processor 220, which may further process the modulation symbols (e.g., for OFDM). TX MIMO processor 220 then provides $N_T$ (e.g., where $N_T$ is a positive integer) modulation symbol streams to $N_T$ transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals may be received by $N_R$ (e.g., where $N_R$ is a positive integer) antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

A receive (RX) data processor 260 then receives and processes the $N_R$ received symbol streams from $N_R$ receivers 254 based on a particular receiver processing technique to provide $N_T$ "detected" symbol streams. The RX data processor 260 then demodulates, deinterleaves, and decodes each detected symbol stream to recover the traffic data for the data stream. The processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software/firmware for the receiver system 250. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Any one of the processor 270, RX data processor 260, TX data processor 238, or other processors/elements, or a combination thereof of the receiver system 250 and/or any one of the processor 230, TX MIMO processor 220, TX data processor 214, RX data processor 242, or other processors/elements, or a combination thereof of the transmitter system 210 may be configured to perform the procedures decoding low density parity check (LDPC) codes including early termination techniques for LDPC decoders in accordance with certain aspects of the present disclosure discussed below. In an aspect, at least one of the processor 270, RX data processor 260, and TX data processor 238 may be configured to execute algorithms stored in memory 272 for performing the procedures for decoding low density parity check (LDPC) codes including early termination techniques for LDPC decoders described herein. In another aspect, at least one of the processor 230, TX MIMO processor 220, TX data processor 214, and RX data processor 242 may be configured to execute algorithms stored in memory 232 for performing the procedures for decoding low density parity check (LDPC) codes including early termination techniques for LDPC decoders described herein.

Figure 3:
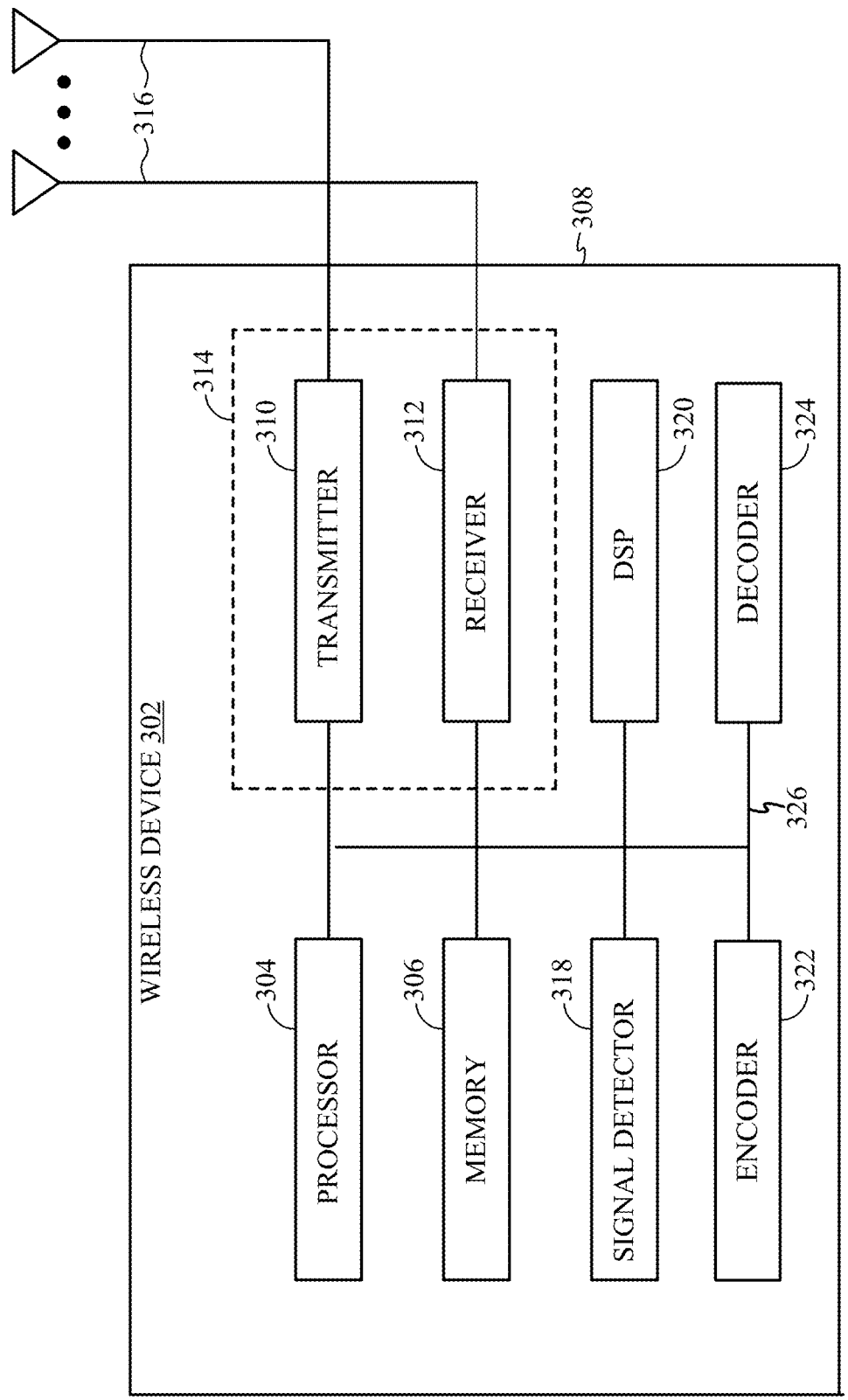
FIG. 3 illustrates various components that may be utilized in a wireless device, according to certain aspects of the present disclosure.

FIG. 3 illustrates various components that may be utilized in a wireless device 302 that may be employed within the wireless communication system 100 illustrated in FIG. 1. The wireless device 302 is an example of a device that may be configured to implement the various methods described herein. The wireless device 302 may be a Node B 102 (e.g., a TRP) or any of the wireless nodes (e.g., wireless nodes 116, 122, 130 or IoT device 136 or 142). For example, the wireless device 302 may be configured to perform operations 1200 described in FIG. 12 and/or operations 1800 illustrated in FIG. 18, as well as other operations described herein.

The wireless device 302 may include a processor 304 that controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein, for example, to allow a UE to decode low density parity check (LDPC) codes including early terminate LDPC decoding. Some non-limiting examples of the processor 304 may include Snapdragon processor, application specific integrated circuits (ASICs), programmable logic, etc.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers. The wireless device 302 can also include wireless battery charging equipment.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the decoder 324 may perform decoding according to certain aspects presented herein (e.g., by implementing operations 1200 illustrated in FIG. 12 and/or operations 1800 illustrated in FIG. 18).

The various components of the wireless device 302 may be coupled together by a bus system 326, which may include a power bus, a control signal bus, and a status signal bus in addition to a data bus. The processor 304 may be configured to access instructions stored in the memory 306 to perform decoding low density parity check (LDPC) codes including early termination techniques for LDPC decoders, in accordance with aspects of the present disclosure discussed below.

Example Error Correction Coding

Many communications systems use error-correcting codes. Specifically, error correcting codes compensate for the intrinsic unreliability of information transfer in these systems by introducing redundancy into the data stream. Low density parity check (LDPC) codes are a particular type of error correcting codes which use an iterative coding system. In particular, Gallager codes are an early example of regular LDPC codes. LDPC codes are linear block code in which most of the elements of its parity check matrix H are '0'.

LDPC codes can be represented by bipartite graphs (often referred to as "Tanner graphs"), wherein a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets and with edges connecting nodes of two different types, variable and check.

A lifted graph is created by copying a bipartite base graph (G), which may also be known as a protograph, a number of times, Z. A variable node and a check node are considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the Z copies of G. A bit sequence having a one-to-one association with the variable node sequence is a valid code word if and only if, for each check node, the bits associated with all neighboring variable nodes sum to zero modulo two (i.e., they include an even number of 1's). The resulting LDPC code may be quasi-cyclic (QC) if the permutations used are cyclic.

Figures 4, 4A:
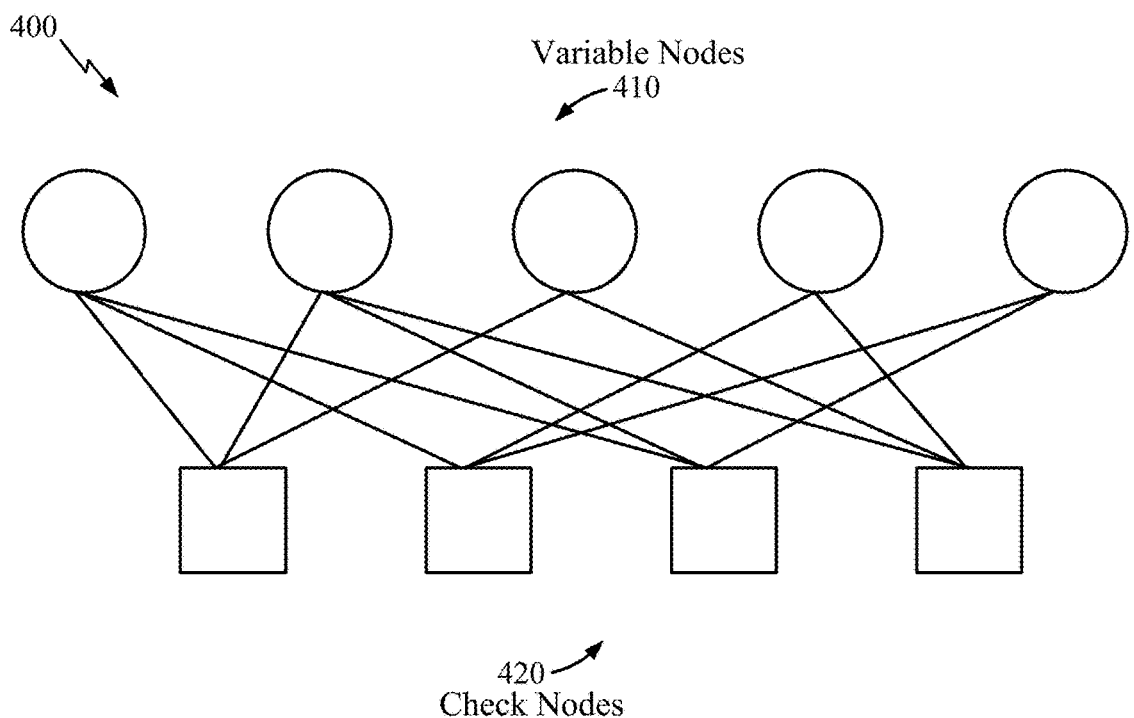
FIGS. 4-4A show graphical and matrix representations of an exemplary low density parity check (LDPC) code, according to certain aspects of the present disclosure.

FIGS. 4-4A show graphical and matrix representations of an exemplary LDPC code, in accordance with certain aspects of the present disclosure. For example, FIG. 4 shows a bipartite graph 400 representing an exemplary LDPC code. The bipartite graph 400 includes a set of 5 variable nodes 410 (represented by circles) connected to 4 check nodes 420 (represented by squares). Edges in the graph 400 connect variable nodes 410 to the check nodes 420 (represented by the lines connecting the variable nodes 410 to the check nodes 420). This graph consists of $|V|=5$ variable nodes and $|C|=4$ check nodes, connected by $|E|=12$ edges.

The bipartite graph may be represented by a simplified adjacency matrix, which may also be known as a parity check matrix. FIG. 4A shows a matrix representation 400A of the bipartite graph 400. The matrix representation 400A includes a parity check matrix H and a code word vector x, where x1-x5 represent bits of the code word x. The parity matrix H is used for determining whether a received signal was normally decoded. The parity check matrix H has C rows corresponding to j check nodes and V columns corresponding to i variable nodes (i.e., a demodulated symbol), where the rows represent the equations and the columns represents the bits of the code word. In FIG. 4A, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the i-th column and in the j-th row of the parity check matrix H. That is, the intersection of an i-th row and a j-th column contains a "1" where an edge joins the corresponding vertices and a "0" where there is no edge. The code word vector x represents a valid code word if and only if Hx=0 (e.g., if, for each constraint node, the bits neighboring the constraint (via their association with variable nodes) sum to zero modulo two, i.e., they comprise an even number of ones). Thus, if the code word is received correctly, then Hx=0 (mod 2). When the product of a coded received signal and the parity check matrix H becomes '0', this signifies that no error has occurred. The parity check matrix is a C row by V column binary matrix. The rows represent the equations and the columns represent the digits in the code word.

The number of demodulated symbols or variable nodes is the LDPC code length. The number of non-zero elements in a row (column) is defined as the row (column) weight dc (dv).

The degree of a node refers to the number of edges connected to that node. This feature is illustrated in the H matrix shown in FIG. 4A where the number of edges incident to a variable node 410 is equal to the number of 1's in the corresponding column and is called the variable node degree d(v). Similarly, the number of edges connected with a check node 420 is equal to the number of ones in a corresponding row and is called the check node degree d(c).

A regular graph or code is one for which all variable nodes have the same degree, j, and all constraint nodes have the same degree, k. In this case, we say that the code is a (j, k) regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit-columns and a number (N) of code bit columns. Lifting the base graph a number (Z) of results in a final block length of KZ.

Thus, a larger graph can be obtained by a "copy and permute" operation where multiple copies of the base graph are made and connected to form a single lifted graph. For the multiple copies, like edges that are a set of copies of a single base edge, are permutated and connected to form a connected graph Z times larger than the base graph.

Figure 5:
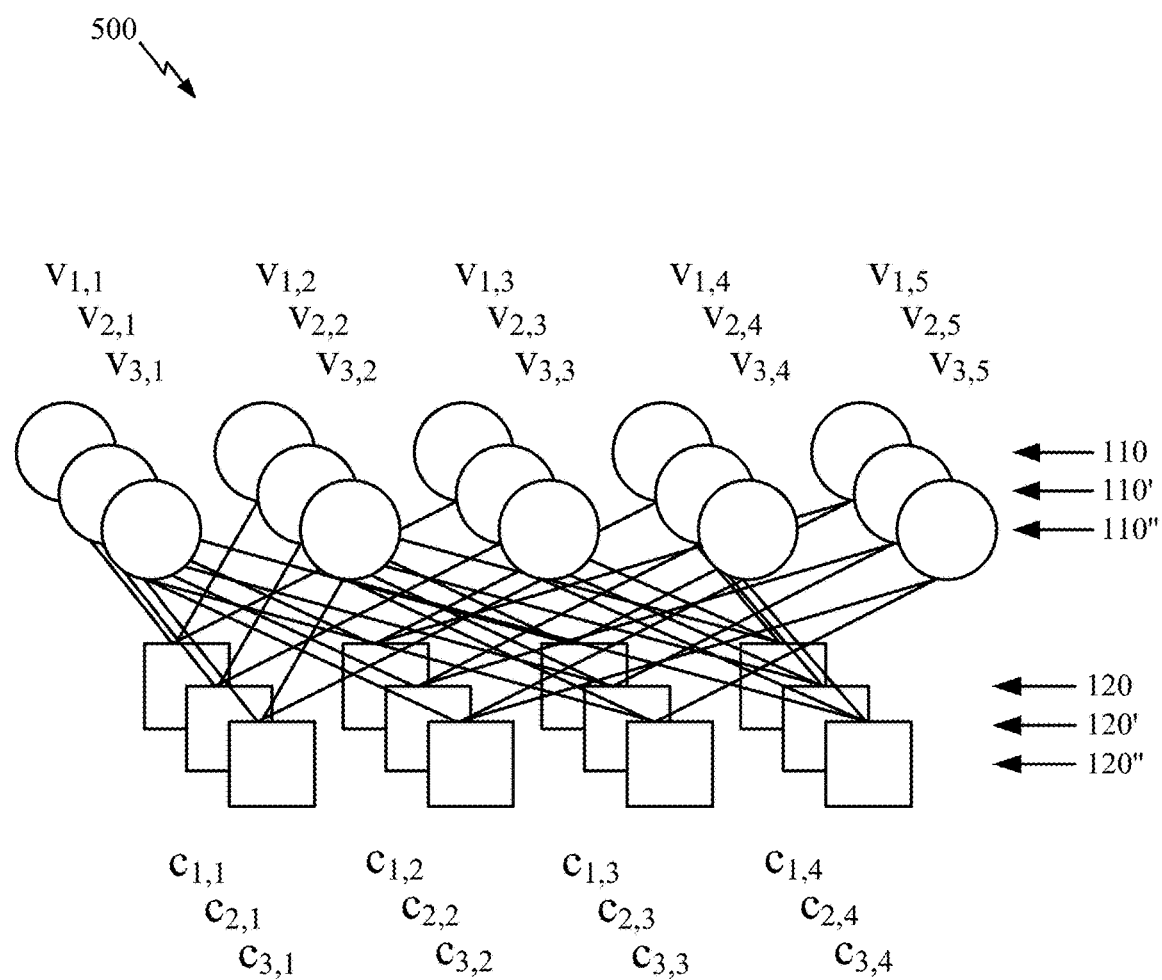
FIG. 5 graphically illustrates lifting of the LDPC code of FIG. 4A, according to certain aspects of the present disclosure.

FIG. 5 graphically illustrates the effect of making three copies of the graph of FIG. 4. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, we can apply the "copy and permute" operation to a base graph.

A corresponding parity check matrix of the lifted graph can be constructed from the parity check matrix of the base graph by replacing each entry in the base parity check matrix with a Z×Z matrix. The 0 entries (those having no base edges) are replaced with the 0 matrix and the 1 entries (indicating a base edge) are replaced with a Z×Z permutation matrix. In the case of cyclic liftings the permutations are cyclic permutations.

A cyclically lifted LDPC code can also be interpreted as a code over the ring of binary polynomials modulo $x^Z+1$. In this interpretation, a binary polynomial, $(x)=b_0+b_1 x+b_2 x^2+ \ldots +b_{Z-1} x^{Z-1}$ may be associated to each variable node in the base graph. The binary vector $(b_0, b_1, b_2, \ldots, b_{Z-1})$ corresponds to the bits associated to Z corresponding variable nodes in the lifted graph, that is, Z copies of a single base variable node. A cyclic permutation by k of the binary vector is achieved by multiplying the corresponding binary polynomial by $x^k$ where multiplication is taken modulo $x^Z+1$. A degree d parity check in the base graph can be interpreted as a linear constraint on the neighboring binary polynomials $B_1(x), \ldots, B_d(x)$ written as $x^{k_1} B_1(x)+x^{k_2} B_2(x)+ \ldots +x^{k_d} B_d(x)=0$ where the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^Z+1$. Such a matrix may be written by giving the value k in place of $x^k$. In this case the 0 polynomial is sometimes represented as −1 and sometimes as another character in order to distinguish it from $x^0$.

Figure 6:
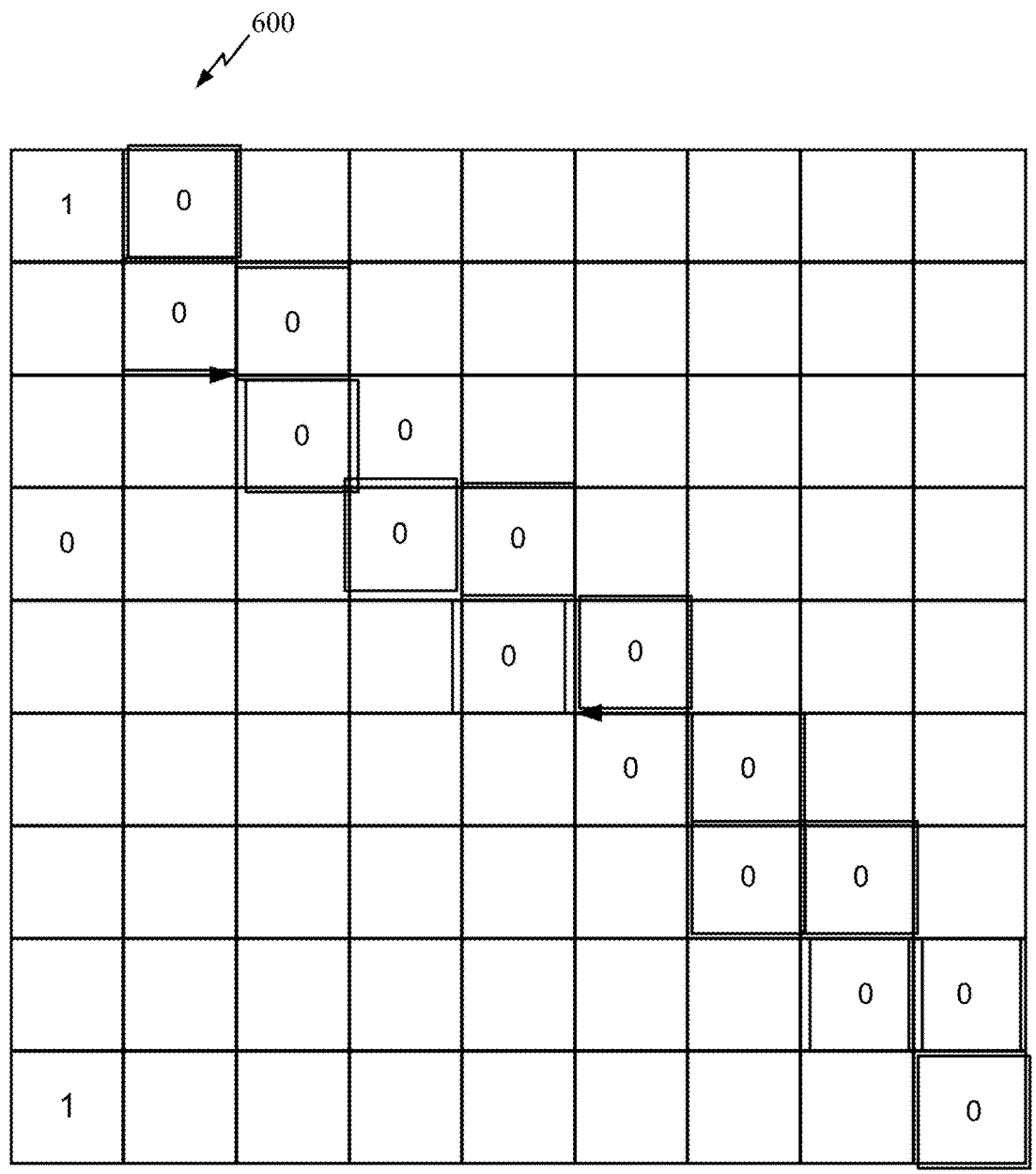
FIG. 6 is an integer representation of a matrix for a quasi-cyclic 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving Mc=s=Nd where c and d comprise x. In the case of quasi-cyclic codes, or cyclically lifted codes, the above algebra can be interpreted as being over the ring of binary polynomials modulo $x^Z+1$. In the case of the 802.11 LDPC codes, which are quasi-cyclic, the encoding submatrix M has an integer representation as shown in FIG. 6.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. However, eliminating double edges in the LDPC code helps to avoid this extra complexity.

LDPC code designs based on cyclic lifting can be interpreted as codes over the ring of polynomials modulo may be binary polynomials modulo $x^Z+1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

Figure 7:
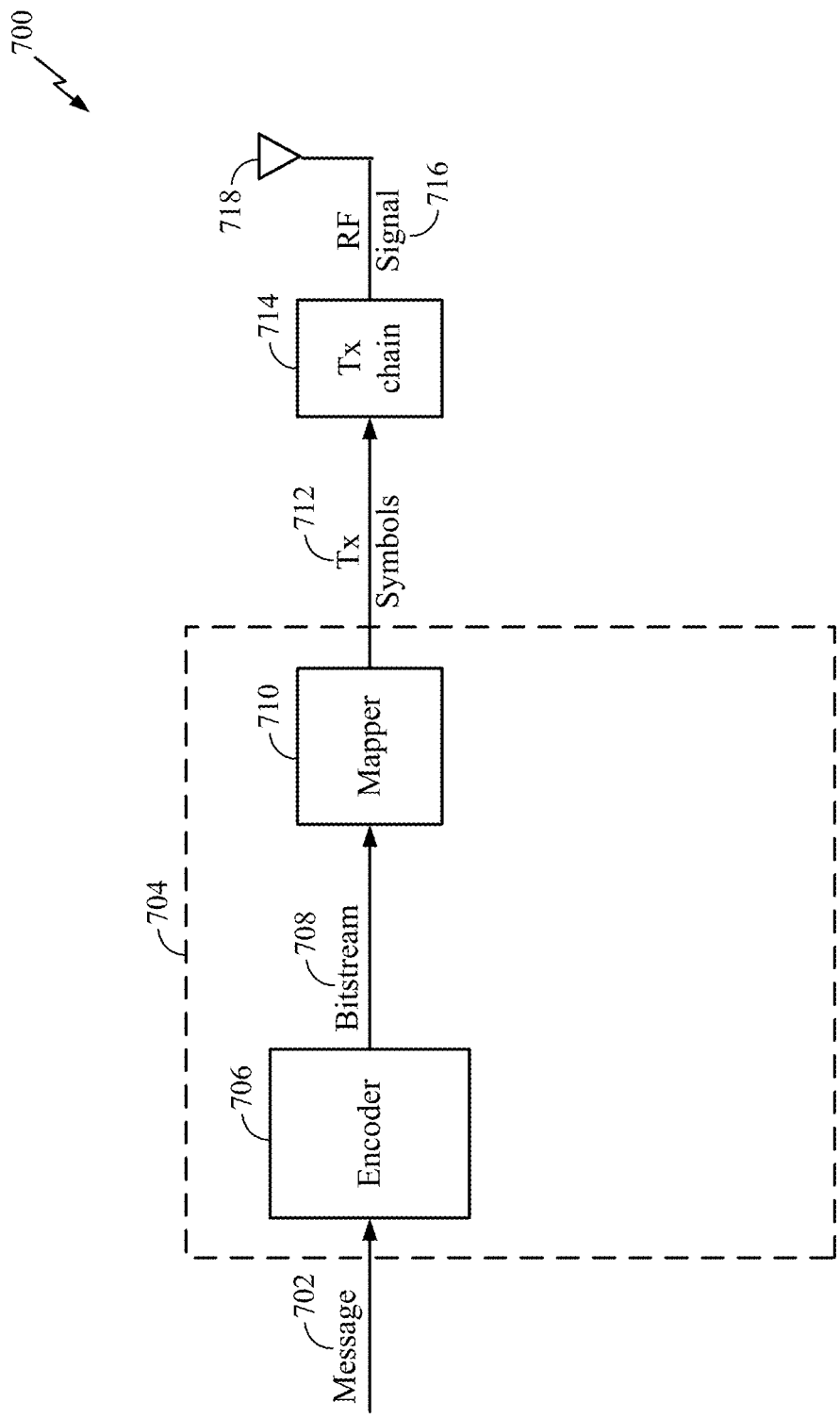
FIG. 7 is a simplified block diagram illustrating a puncturing encoder, according to certain aspects of the present disclosure.

FIG. 7 illustrates a portion of a radio frequency (RF) modem 704 that may be configured to provide an encoded message for wireless transmission. In one example, an encoder 706 in a base station (e.g., Node B 102 and/or transmitter system 210) (or wireless node on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the base station or another network entity. In some cases, the encoder 706 may encode the message, for example, using techniques described above (e.g., by using a LDPC code). An encoded bitstream 708 produced by the encoder 706 may then be provided to a mapper 710 that generates a sequence of Tx symbols 712 that are modulated, amplified and otherwise processed by Tx chain 714 to produce an RF signal 716 for transmission through antenna 718.

Figure 8:
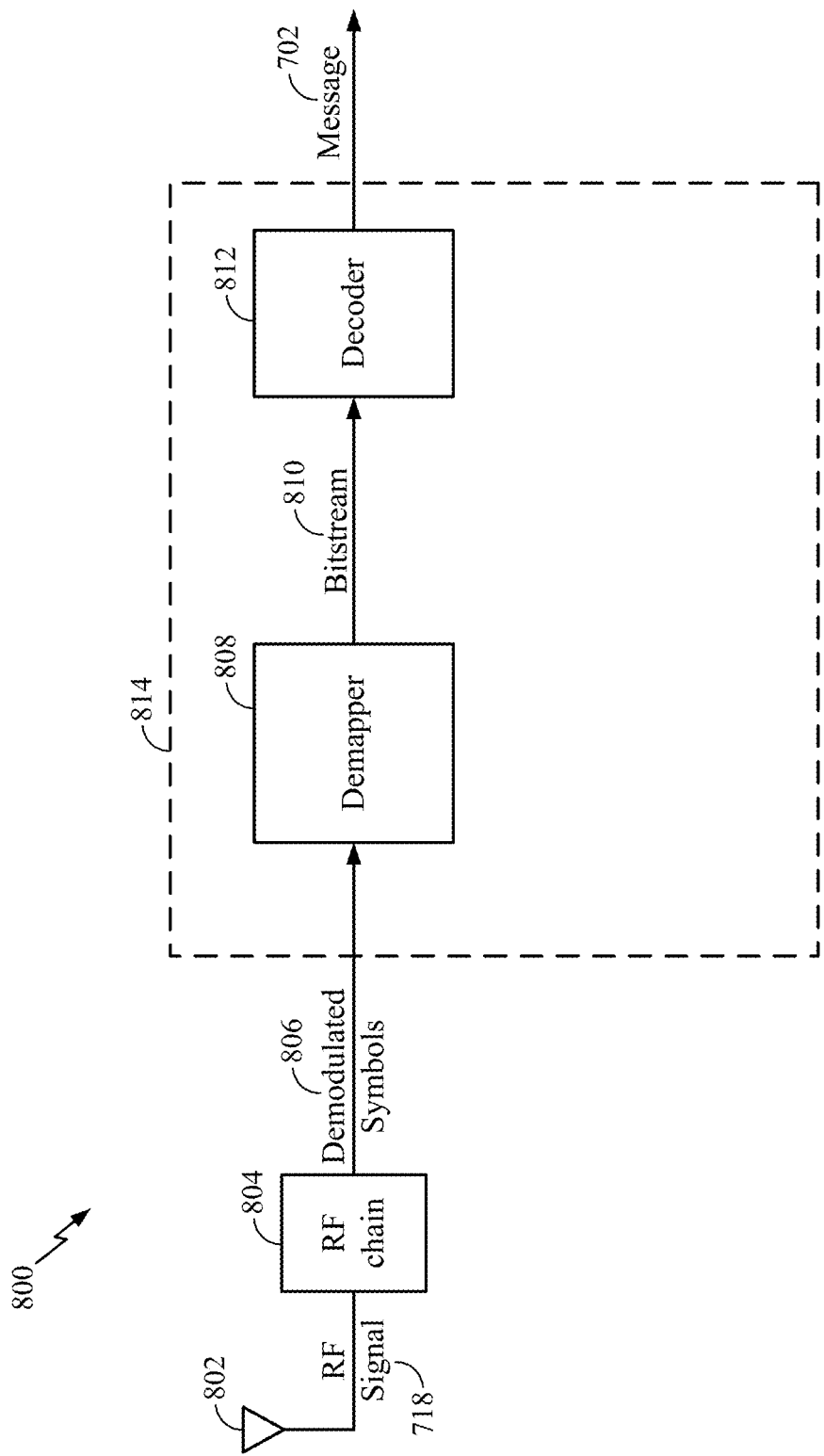
FIG. 8 is a simplified block diagram illustrating a decoder, according to certain aspects of the present disclosure.

FIG. 8 illustrates a portion of a RF modem 814 that may be configured to receive and decode a wirelessly transmitted signal including an encoded message (e.g., a message encoded using a LDPC code as described above). In various examples, the modem 814 receiving the signal may reside at the wireless node (e.g., wireless node 116, receiver system 250), at the base station (e.g., Node B 102, transmitter system 210), or at any other suitable apparatus or means for carrying out the described functions (e.g., wireless device 302). An antenna 802 receives an RF signal 716 (i.e., the RF signal 716 produced in FIG. 7) for a wireless node (e.g., wireless node 116, 118, and/or receiver system 250). An RF chain 804 processes and demodulates the RF signal 716 and may provide a sequence of demodulated symbols 806 to a demapper 808, which produces a bitstream 810 representative of the encoded message.

A decoder 812 may then be used to decode m-bit information strings from a bitstream that has been encoded using a coding scheme (e.g., an LDPC code). The decoder 812 may comprise a layered LDPC decoder with a full-parallel, row-parallel, or block-parallel architecture. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit of the code word) that indicates an estimate of the associated bit's value as determined by observations from the communications channel. The "soft bit" may be represented by a log-likelihood ratio (LLR) that in some aspects may be defined as the log ((probability the bit is 0)/(probability the bit is 1)). Using these LLRs the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel. According to aspects, following these decoding techniques, the decoder 812 may decode the bitstream 810 based on the LLRs to determine the message 702 containing data and/or encoded voice or other content transmitted from the base station (e.g., Node B 102 and/or transmitter system 210). The decoder may decode the bitsteam 810 in accordance with aspects of the present disclosure presented below (e.g., by implementing operations 1200 illustrated in FIG. 12 and/or operations 1800 illustrated in FIG. 18).

Example LDPC Decoder Architecture

Low-density parity check (LDPC) is a powerful error correcting coding technology used in several applications such as wireless communications, storage and Ethernet. LDPC is based on designing codes on bipartite graphs, for example, as illustrated in FIG. 4. LDPC decoding is typically implemented using belief propagation techniques, described above, where messages are passed along edges of the graph and the nodes in the graph compute their marginal distributions from which decisions on the source symbols can be made. Quasi-Cyclic (QC) codes are a popular class of structured LDPC codes where a base LDPC Parity Check Matrix (PCM) gets 'lifted'. For example, "lifting" entails replacing each base PCM entry with a Z×Z submatrix. The Z×Z submatrix can be a matrix of all zeros for '0' base PCM entries or a cyclically rotated identity matrix for '1' base PCM entries. QC LDPC codes enable parallel processing in hardware by enabling decoders, such as the decoder illustrated in FIG. 8, to replicate processing Z times with switching networks to exchange messages.

LDPC decoders implement message passing architectures to implement iterative Belief Propagation (BP) algorithms. The log BP algorithm may be written as:

$$A_{mj} = \sum_{\substack{n \in N(m) \\ n \neq j}} \Psi(L(q_{mn})) \quad \text{(eq. 1)}$$

$$s_{mj} = \prod_{\substack{n \in N(m) \\ n \neq j}} \text{Sign}(L(q_{mn})) \quad \text{(eq. 2)}$$

$$R_{mj} = -s_{mj}\Psi(A_{mj}) \quad \text{(eq. 3)}$$

$$L(q_j) = \sum_{m \in M(j)} R_{mj} + \frac{-2r_j}{\sigma^2} \quad \text{(eq. 4)}$$

$$L(q_{mj}) = L(q_j) - R_{mj} \quad \text{(eq. 5)}$$

where L(c) is a log-likelihood ratio defined as $$L(c) = \log \frac{\text{Probability } c = 0}{\text{Probability } c = 1},$$

m is the parity check node or PCM row index, j is the bit node or PCM column index, N(m) is the set of all bit indices for bits connected to parity check node m and M(j) is the set of all parity check node indices for all parity check nodes connected to bit j. L($q_{mj}$) may be initialized using LLRs for each bit of the code word, also referred to as bit LLRs, determined by observations from the communications channel such as using $$\frac{-2r_j}{\sigma^2}$$

where $r_j$ is the fading gain, and $\sigma^2$ is the channel variance.

According to aspects, Equation 1 computes a parity check metric $A_{mj}$ for bit j that sums the incoming bit LLRs L($q_{mn}$) for all bits connected to parity check node m (other than the LLR for bit j) through a transformation Ψ. This operation along with Equation 3 computes an a posteriori LLR $R_{mj}$ for bit j based observations of the other bits belonging to the parity check m. Equation 2 computes the sign $s_{mj}$ of the a posteriori LLR $R_{mj}$ based on the signs of the incoming bit LLRs L($q_{mn}$). Equation 4 calculates the updated bit LLRs L($q_j$) by combining all of the a posteriori LLR's $R_{mj}$ (extrinsic LLRs) from the decoder for bit j with the a priori LLR $$\frac{-2r_j}{\sigma^2}$$

from me channel (intrinsic LLR). Equation 5 subtracts the extrinsic LLR $R_{mj}$ for parity check node m from the bit LLR sum L($q_j$) before the bit LLR sum L($q_{mj}$) is passed back to parity check node m for computation of an updated extrinsic LLR $R_{mj}$ in the next iteration. For a 'flooding' LDPC decoder iteration, steps 1-3 (i.e., computing Equations 1-3) are performed for all parity check nodes after which all bit (variable) nodes perform step 4 (i.e., compute Equation 4) to update the bit LLRs L($q_j$).

Layered LDPC decoders, for example, as presented herein, perform steps similar to Equations 1-5 above, but with some slight modifications. For example, the layered log BP algorithm may be written as:

$$L(q_{mj}) = L(q_j) - R_{mj} \quad \text{(eq. 6)}$$

$$A_{mj} = \sum_{\substack{n \in N(m) \\ n \neq j}} \Psi(L(q_{mn})) \quad \text{(eq. 7)}$$

$$s_{mj} = \prod_{\substack{n \in N(m) \\ n \neq j}} \text{Sign}(L(q_{mn})) \quad \text{(eq. 8)}$$

$$R_{mj} = -s_{mj}\Psi(A_{mj}) \quad \text{(eq. 9)}$$

$$L(q_j) = L(q_{mj}) + R_{mj} \quad \text{(eq. 10)}$$

In the above layered decoding steps (i.e., Equations 6-10), the bit LLRs L($q_j$) are initialized with the channel bit LLRs $$\frac{-2r_j}{\sigma^2}.$$

According to certain aspects, a key difference between layered decoding (Equations 6-10) and flooding decoding (Equations 1-5) is that in a layered decoding iteration, when the a posteriori LLR, $R_{mj}$, is computed for a particular parity check node (PCM row) in Equation 9, the bit LLRs $L(q_j)$ are immediately updated with the new a posteriori LLRs $R_{mj}$ in Equation 10 before computing the next row's a posteriori LLRs $R_{mj}$ in Equations 6-9. This is in contrast to the flooding decoder where all of the a posteriori LLRs $R_{mj}$ corresponding to the PCM rows are computed (Equations 1-3 loop over all m and j) before all of the bit LLRs $L(q_j)$ are updated with the a posteriori LLRs $R_{mj}$ in Equation 4. As a result, layered decoding allows information, in the form of updated a posterior LLRs $R_{mj}$, to propagate through the belief propagation message passing faster than a flooding decoder, which results in faster decoder convergence.

Figure 9:
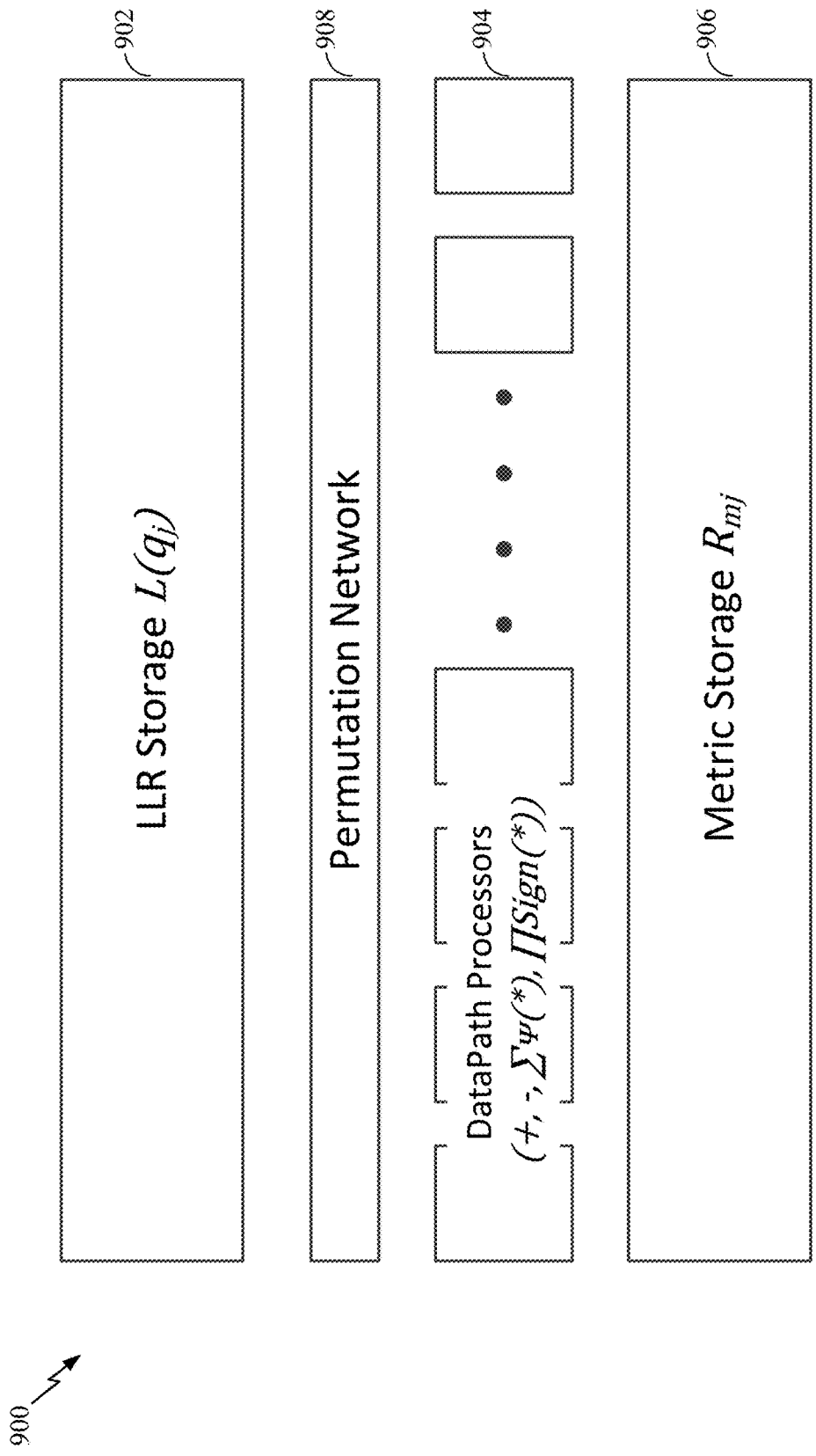
FIG. 9 illustrates a high level block diagram of a generic layered LDPC Decoder, according to certain aspects of the present disclosure

FIG. 9 illustrates a high level block diagram of a generic layered LDPC decoder 900, which may be an example of the decoder illustrated in FIG. 8. As illustrated, the layered LDPC decoder includes LLR storage memory 902 for storing bit LLRs (e.g., $L(q_j)$) (i.e., one bit LLR per bit of the code word), which is initialized by the channel bit LLRs $$\left( \text{e.g.,} \frac{-2r_j}{\sigma^2} \right),$$

which, in turn, are updated by a posteriori LLRs (e.g., $R_{mj}$). Layered LDPC decoder 900 also includes data path processors 904 which may operate in parallel to compute a posteriori LLRs and update the stored bit LLRs in the LLR storage memory 902. Layered LDPC decoder 900 additionally includes a metric storage memory 906 to store a posteriori LLRs computed by the data path processors 904 and a permutation network 908 to route LLRs (e.g., bit LLRs and a posteriori LLRs) between the memories 902, 906 and the data Path processors 904.

As discussed above, layered decoding traverses PCM columns (bit LLRs) along a row in the PCM to compute a posteriori LLRs for that row. After a posteriori LLRs for the row are computed, the bit LLRs are each immediately updated with their corresponding a posteriori LLR as they are being fed to the computation of the a posteriori LLRs for the next row. If the column index of the updated bit LLR is connected to the next row, then the updated bit LLR is passed to the a posteriori LLR computation for that next row. If there is no connection then the updated bit LLR can be stored to LLR storage memory 902.

FIG. 10 illustrates an example of this process for computing/updating bit LLRs and a posteriori LLRs in a parity check matrix (PCM). In particular, each cell of the PCM illustrates a calculated a posteriori LLR. For example, for the PCM illustrated in FIG. 10, once the a posteriori LLRs for row 3 are computed, the bit LLR for column 5 may be updated (e.g., using Equation 10) and used in the a posteriori LLR computation for row 4 (e.g., using Equations 6-9) since column 5 is connected to both rows 3 and 4 (e.g., PCM entries (3, 5) and (4, 5) are non-zero). However, when the bit LLR for column 6 is updated with an a posteriori LLR computed from row 3, the updated bit LLR is stored in memory (e.g., LLR storage memory 902) because the a posteriori LLR computation for row 4 does not include column 6 given that (4, 6) is empty. When the a posteriori LLRs for row 5 are being computed, the bit LLR for column 6 is read from the memory rather than being passed from the prior update computation. It should also be noted that write and read conflicts are possible since Equations 6 and 10 can both read and write the LLR storage memory 902. Such conflicts can create bubbles (e.g., delays) in a processing pipeline if the LLR storage memory 902 has just a single read and a single write port.

There can also be bubbles introduced due to the recursive processing where bit LLR updates for a row (layer) get passed to the a posteriori LLR processing for the next layer for which the computed a posteriori LLRs are used to update the bit LLRs again. For example, given a nonzero processing pipeline depth, there may be a gap between bit LLR update phases so that a posteriori LLR calculations can complete.

Figure 11A:
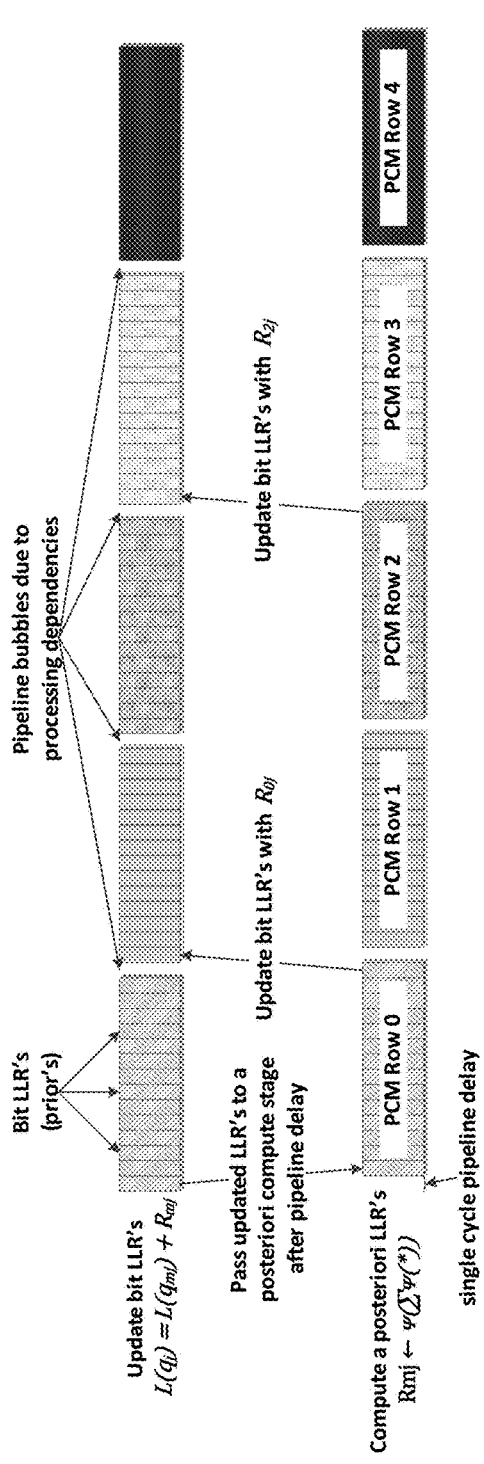
FIGS. 11A and 11B illustrate an example layered decoder pipeline processing timeline, according to certain aspects of the present disclosure.
Figure 11B:
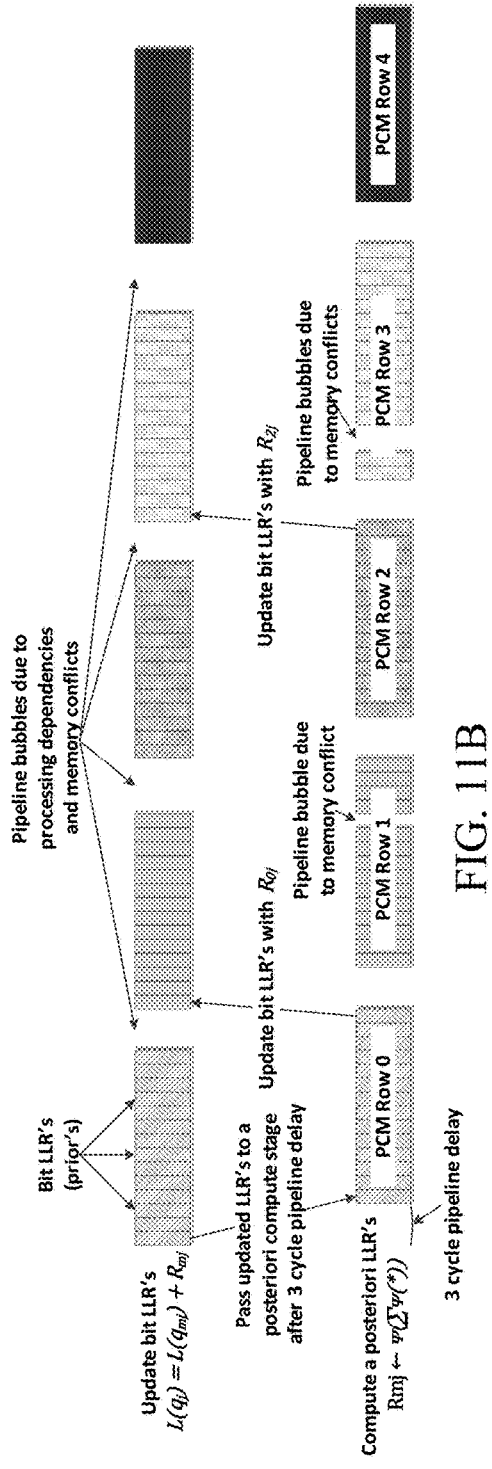

For example, FIG. 11A illustrates this row by row processing for computing a posteriori LLRs and updating the bit LLRs based on the a posteriori LLRs. As illustrated in FIG. 11A, pipeline bubbles (e.g., gaps in the processing) are present due to recursive processing with an interdependency between the a posteriori computation (e.g., Equations 6-9) and the bit LLR update steps (e.g., Equation 10). The pipeline bubbles grow with increasing pipeline depth as well as memory conflicts as illustrated in FIG. 11B where it can be seen that an increase in pipeline depth to 3 cycles along with memory conflicts can increase the number of cycles wasted due to pipeline bubbles. Thus, aspects of the present disclosure present techniques for mitigating pipeline bubbles, for example, by relaxing the dependency between updating bit LLRs and computing a posteriori LLRs so that for a particular row, the a posteriori processing can use the latest available bit LLR's rather than waiting for the latest updates to occur.

Figure 12:
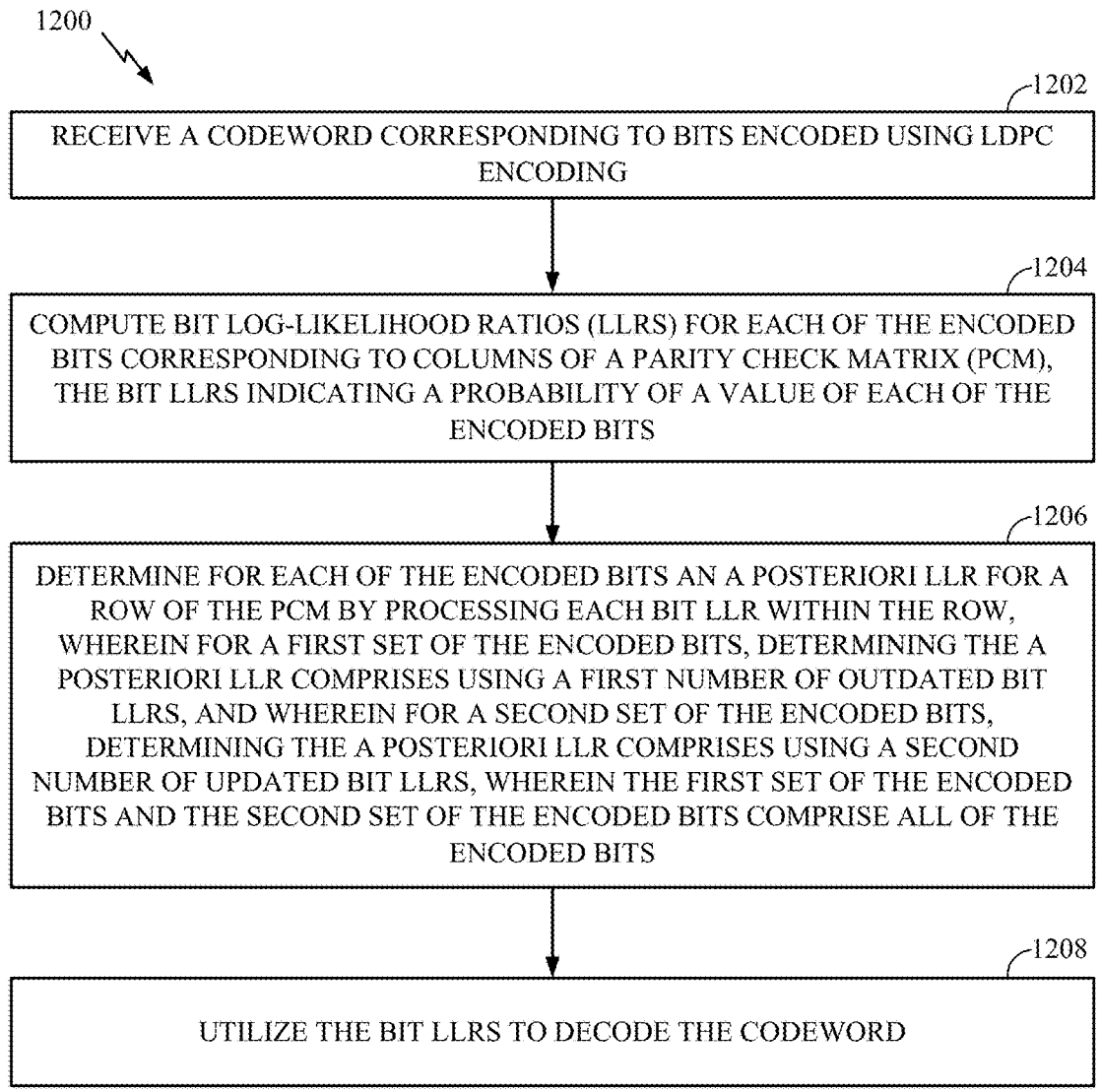
FIG. 12 is a flow diagram illustrating example operations for decoding low-density parity check (LDPC) codes, according to certain aspects of the present disclosure.

FIG. 12 illustrates example operations 1200 for wireless communications, for example, for reducing processing delays and memory conflicts when decoding LDPC code words. According to certain aspects, operations 1200 may be performed by a decoder (e.g., decoder 800) in a wireless communications device, such as a base station (e.g., Node B 110 and/or base station 210), a user equipment (e.g., UE 116 and/or UE 250), and/or wireless device 302.

Operations 1200 begin at 1202 by receiving a code word corresponding to bits encoded using LDPC encoding. At 1204, the wireless communications device computes bit log-likelihood ratios (LLRs) for each of the encoded bits corresponding to columns of a parity check matrix (PCM), the bit LLRs indicating a probability of a value of each of the encoded bits. At 1206, the wireless communications device determines for each of the encoded bits an a posteriori LLR for a row of the PCM by processing each bit LLR within the row, wherein for a first set of the encoded bits, determining the a posteriori LLR comprises using a first number of outdated bit LLRs, and wherein for a second set of the encoded bits, determining the a posteriori LLR comprises using a second number of updated bit LLRs, wherein the first set of the encoded bits and the second set of the encoded bits comprise all of the encoded bits. At 1208, the wireless communications device utilizes the bit LLRs to decode the code word.

As noted above, to mitigate pipeline bubbles the dependency between updating bit LLRs and computing a posteriori LLRs may be relaxed so that, for a particular row, the a posteriori processing can use the latest available bit LLRs (e.g., outdated bit LLRs) rather than waiting for the latest updates (e.g., updated bit LLRs) to occur.

Figure 13:
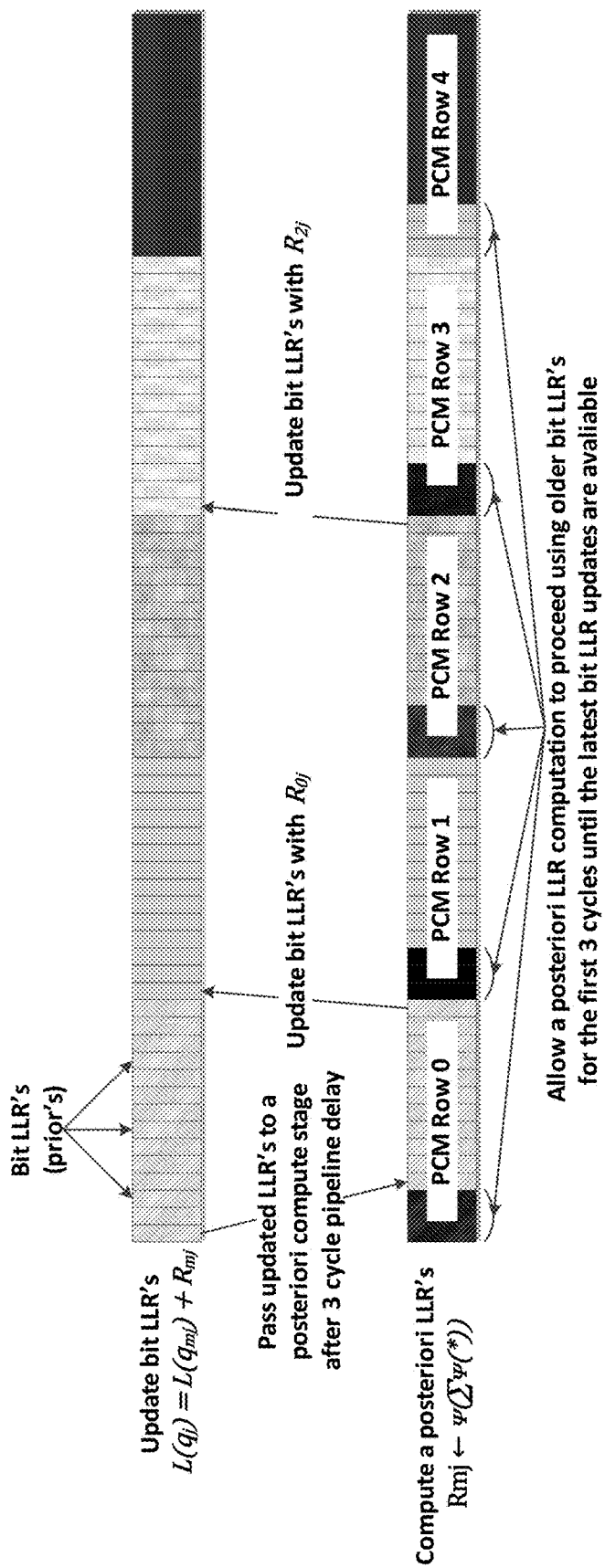
FIG. 13 illustrates an example LLR processing pipeline where dependency between updating bit LLRs and computing a posteriori LLRs has been relaxed, according to aspects of the present disclosure.

FIG. 13 illustrates an example LLR processing pipeline where dependency between updating bit LLRs and computing a posteriori LLRs has been relaxed. For example, as illustrated, during computation of the a posteriori LLRs, instead of waiting for bit LLRs to be updated in a previous iteration and be passed to the current a posteriori LLR computation (e.g., after a 3 cycle pipeline delay), the a posteriori LLR computation may proceed without the updated bit LLRs, using a first number of outdated bit LLRs corresponding to a first number of bits and using a second number of updated bit LLRs corresponding to a second number of bits. For example, as illustrated in FIG. 13, for PCM Row 0, the a posteriori LLR computation may begin using older (e.g., outdated/not updated) bit LLRs for the first three cycles until the latest, updated bit LLRs become available (e.g., are passed to the a posteriori LLR computation stage after a three cycle pipeline delay).

According to aspects, while such a relaxation reduces pipeline bubbles, this is at the expense of decoder performance degradation due to delay introduced in the message passing. However, depending on the amount of message passing delay (which is proportional to the pipeline depth), the performance degradation from such delays tend to be minor and also tend to be balanced by the reduction in cycles per iteration due to the removal of pipeline bubble overheads. This is because the reduction in cycles per iteration results in more PCM rows being processed within a constant time period compared to a layered decoder without this message passing relaxation, which may result in performance improvements that can make up for degradation due to the message passing delay. Additionally, allowing for message passing delay provides a deeper pipeline, which translates to a higher achievable clock frequency for the decoding operation.

For layered decoding, Equation 6 may be performed to subtract the last a posteriori message from the bit LLR, $L(q_j)$, before feeding it to the a posteriori computation to compute a new a posteriori message which is then used to update $L(q_{mj})$. If $L(q_{mj})$ is stored to the LLR memory (e.g., LLR Memory Store 902) for updating in Equation 10, and if there is delay in the message passing, there may potentially be multiple reads of a bit LLR that can take place before an update occurs, which could corrupt the Belief Propagation message passing due to missing a posteriori updates. Additionally, as discussed above, there may be memory conflicts due to Equations 6 and 10 accessing the LLR memory at the same time, and example of which is illustrated in FIGS. 14A and 14B.

Figures 14A, 14B:
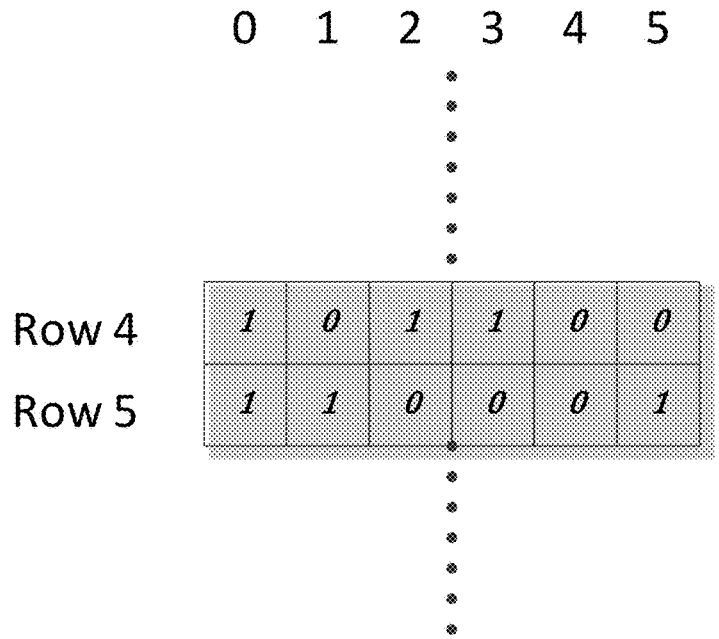
FIG. 14A illustrates an example PCM for the purposes of demonstrating memory consistency and conflict issues, according to aspects of the present disclosure.
FIG. 14B illustrates a layered LDPC decoder pipeline that assumes a single cycle latency to write LLR memory and a 3 cycle pipeline depth, according to aspects of the present disclosure.

FIG. 14A illustrates an example PCM for the purposes of demonstrating the memory consistency and conflict issues that may be caused by delayed message passing in a layered LDPC decoder, as discussed above. In the example PCM illustrated in FIG. 14A, row 4 is connected to bits 0, 2 and 3 (e.g., bits (4,0), (4,2), and (4,3) are non-zero) and row 5 is connected to bits 0, 1 and 5 (e.g., bits (5,0), (5,1), and (5,5) are non-zero).

FIG. 14B illustrates a layered LDPC decoder pipeline that assumes a single cycle latency to write LLR memory and a 3 cycle pipeline depth, which illustrates the above discussed memory conflicts with reference to the example PCM illustrated in FIG. 14A. As illustrated, during cycle 0, the decoder computes Equation 6 for row 4, bit 0 by taking the bit LLR for column 0, $L(q_0)$, of the PCM illustrated in FIG. 14A and subtracting the outdated a posteriori LLR, $R_{mj}$, from the bit LLR for column 0. This results in a bit LLR for row 4, column 0 (i.e., $L(q_{40})$). The resultant bit LLR, $L(q_{40})$, needs to be stored somewhere to be used later to compute the updated bit LLR for column 0 (i.e, bit 0) of the PCM, so the decoder overwrites the bit LLR $L(q_0)$ with the value for bit LLR $L(q_{40})$, for example, as illustrated at cycle 1, LLR memory column 0 of FIG. 14B. However, due to pipeline processing delay, overwriting $L(q_0)$ with $L(q_{40})$ presents issues later on during processing of row 5.

For example, as illustrated in cycle 3 of FIG. 14B, due to the pipeline processing delay for providing updated bit LLRs, the processing for Equation 6 reads $L(q_{40})$ from memory instead of an updated $L(q_0)$. That is, during the processing of row 5, the computation of Equation 6 uses bit LLR information for row 4 (i.e., $L(q_{40})$) since the updated $L(q_0)$ (which is derived from $L(q_{40})$) isn't yet stored in memory due to the pipeline processing delay, which may degrade decoder performance. Additionally, for cycle 4, there is a memory conflict as both the processing for Equations 6 and 10 want to write the memory in the same cycle. In some cases, the decoder may chose to either delay the Equation 6 write operation or the Equation 10 write operation to resolve the conflict, which is illustrated in the steps in parenthesis shown in FIG. 14B. Either way, however, there may be undesired behavior. For example, if the Equation 6 write operation occurs first, when the update for row 5 occurs the $L(q_{50})$ message will have been overwritten. Additionally, if the Equation 10 write operation occurs first then the update for row 4 will be overwritten.

According to certain aspects, a slight modification to the layered equations (e.g., Equations 6-10) solves the memory consistency and conflict problems, as illustrated below.

$$L(q_{mj}) = L(q_j) - R_{mj(old)} \quad \text{(eq. 11)}$$

$$A_{mj} = \sum_{\substack{n \in N(m) \\ n \neq j}} \Psi(L(q_{mn})) \quad \text{(eq. 12)}$$

$$s_{mj} = \prod_{\substack{n \in N(m) \\ n \neq j}} \text{Sign}(L(q_{mn})) \quad \text{(eq. 13)}$$

$$R_{mj(new)} = -s_{mj}\Psi(A_{mj}) \quad \text{(eq. 14)}$$

$$L(q_j) = L(q_j) + (R_{mj(new)} - R_{mj(old)}) \quad \text{(eq. 15)}$$

As in Equations 6-9 the $L(q_{mj})$s generated by Equation 11 are fed to the a posteriori processing in Equations 12-14. However, unlike with Equations 6-9, the $L(q_{mj})$s are not stored to LLR memory as shown in the example in FIG. 14B. Instead, the $L(q_j)$ are updated with the difference between the old and the new a posteriori LLRs (i.e., $(R_{mj(new)} - R_{mj(old)})$) as illustrated in Equation 15. According to certain aspects, this operation effectively subtracts out the old a posteriori information from the bit LLR and replaces it with the latest information, such that a computation for a particular row no longer uses information tailored to a previous row as illustrated in the example in FIG. 14B.

Figure 15:
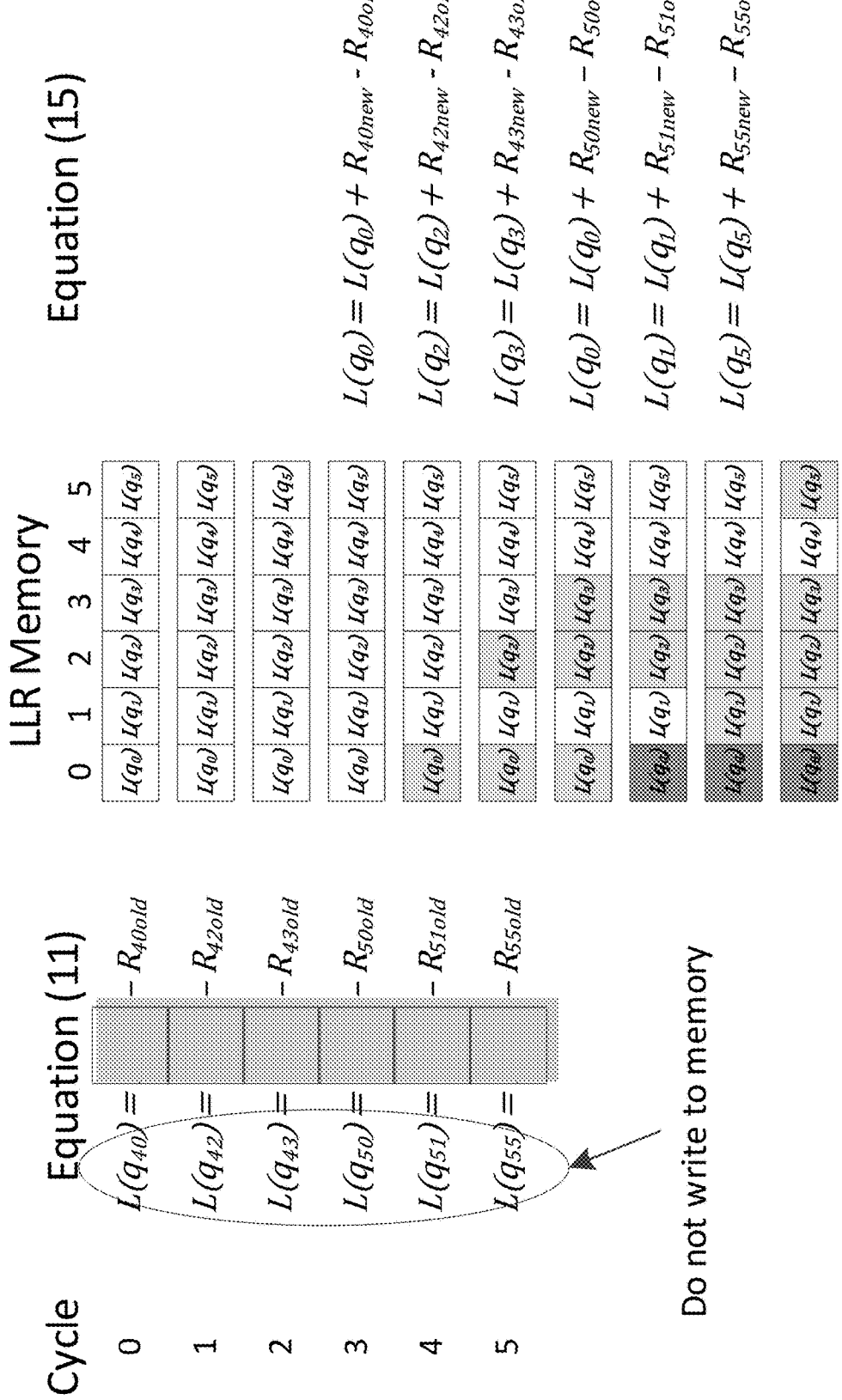
FIG. 15 illustrates bit LLR processing steps corresponding to an example parity check matrix (PCM), according to aspects of the present disclosure.

FIG. 15 illustrates the processing steps for Equations 11-15 corresponding to the example PCM illustrated in FIG. 14A. As can be seen in FIG. 15, there are no consistency conflicts since the $L(q_{mj})$s are not written to memory. Thus, the memory always maintains the latest available $L(q_j)$ value (i.e., outdated or updated bit LLR).

Additionally, as illustrated at cycle 3 in FIG. 15, the $L(q_0)$ value used in the Equation 11 processing comes from the memory and is an older value that has not been updated by the a posteriori LLR for row 4 whose difference update also occurs in cycle 3 for the Equation 15 processing. According to certain aspects, by swapping the Equation 11 processing of $L(q_{50})$ for $L(q_{55})$ allows the latest update of $L(q_0)$ to be used in the $L(q_{50})$ processing as illustrated in FIG. 16.

According to certain aspects, with delay in the message passing the $L(q_j)$ will be read from memory instead of $L(q_{mj})$. Since both Equations 11 and 15 access the memory to read the $L(q_j)$, a high memory bandwidth may be needed to feed the $L(q_j)$ messages to the cycle by cycle processing for both Equations 11 and 15.

FIG. 17 illustrates an exemplary solution for increasing the memory bandwidth to accommodate the processing and updating of LLRs. For example, according to certain aspects, to enable higher read bandwidth without adding expensive additional ports to the memory, the LLR Memory (e.g., LLR memory store 902) may be split into dual banks and the $L(q_j)$ messages can be sorted in the memory banks to avoid conflicts where the Equation 11 processing and Equation 15 processing attempt to read the same bank on the same cycle, for example, as illustrated in FIG. 17.

Figure 16:
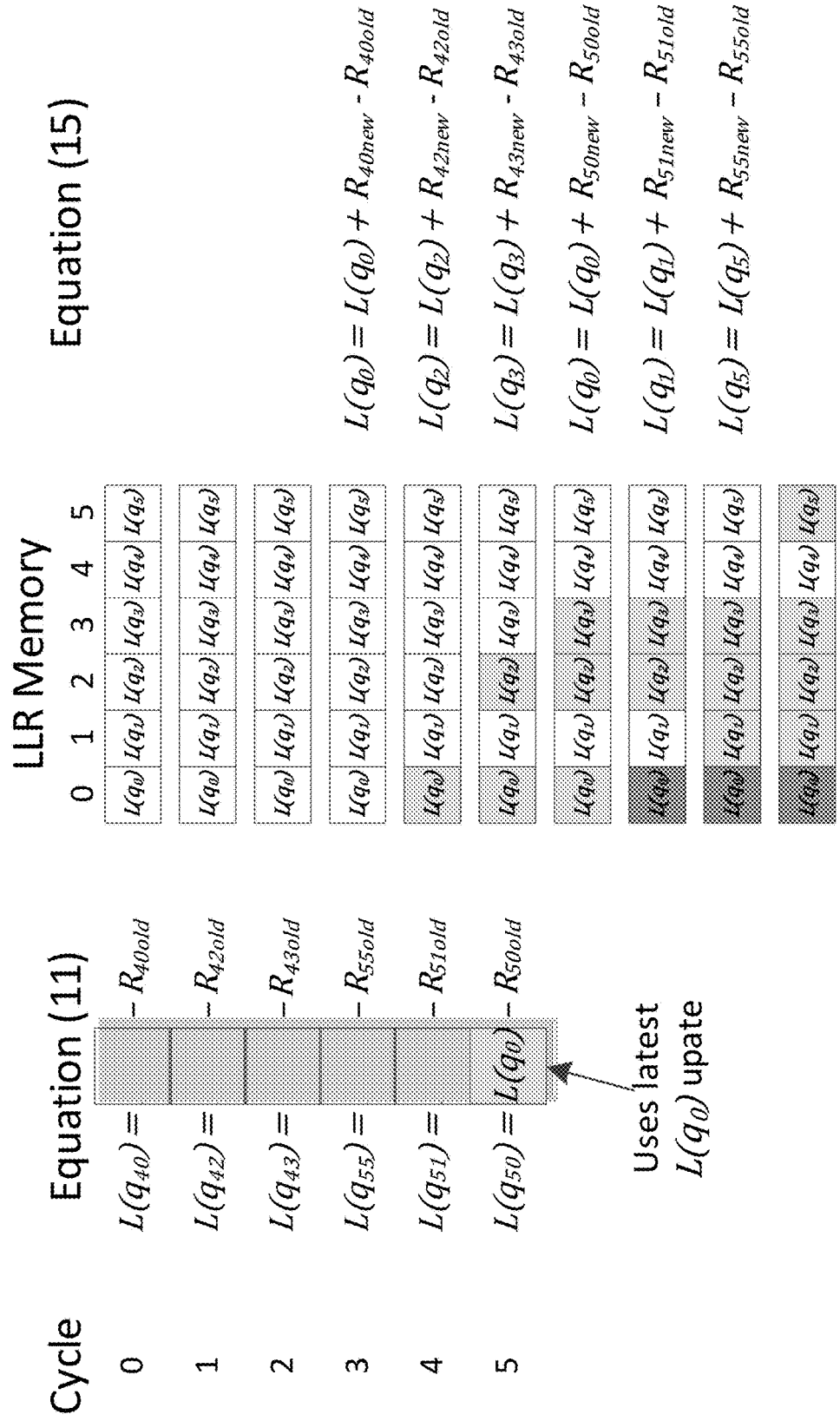
FIG. 16 illustrates swapping of bit LLRs in a layered decoder processing pipeline, according to aspects of the present disclosure.

Additionally, the sorting in memory and the order within which the bit (i.e., column) indexes are processed may also be performed in such a way to maximize passing the latest updated $L(q_j)$ messages illustrated in FIG. 16. For example, in FIG. 17 the memory may be spilt into dual banks (e.g., "LLR memory bank 0" and "LLR memory bank 1"). The total number of bits stored across both banks remains the same as the single memory in FIG. 16. However, according to aspects, if the $L(q_2)$ and $L(q_4)$ columns are swapped then the processing for Equation 11 and Equation 15 does not access the same memory bank on any given cycle to read an $L(q_j)$, thereby increasing the read bandwidth and improving decoding efficiency and time. Additionally, as in FIG. 16, the processing for Equation 11 (e.g., using the dual bank memory in FIG. 17) may use bit indices 5, then 1, and then 0 so that the latest $L(q_0)$ can be used in the a posteriori LLR processing for row 5. In other words, according to certain aspects, when performing the a posteriori LLR and bit LLR update computations (i.e., Equations 11 and 15), the decoder may advantageously choose the PCM row calculation order, sort the a posteriori LLRs and bit LLR updates in memory, and/or choose a memory bank to store the a posteriori LLRs and bit LLR updates to alleviate memory conflicts/consistency errors and reduce pipeline processing delays, thereby increasing decoding efficiency and accuracy.

Example Early Termination Technique for LDPC Decoder Architecture

In certain aspects, a layered LPDC decoder terminates decoding a code word when the parity check for each row of the PCM returns a true value (i.e., the decoded code word as represented by its bit LLRs satisfies each parity check corresponding to each row of the PCM).

Layered decoding processes PCM rows on a row by row basis, and accordingly performs a parity check corresponding to each row of the PCM on a row by row basis. Accordingly, one PCM row is processed at a time, and a parity check corresponding to the row of the PCM is performed on the bit LLR values at the time the PCM row is processed. Further, as discussed above, during processing of the PCM row, layered decoding traverses PCM columns (bit LLRs) along the row in the PCM to compute a posteriori LLRs for that row. After a posteriori LLRs for the row are computed, the bit LLRs are each immediately updated with their corresponding a posteriori LLR as they are being fed to the computation of the a posteriori LLRs for the next row. Since the bit LLRs are updated for each PCM row processed, the bit LLRs used for processing of one PCM row may be different than the bit LLRs used for processing of a subsequent PCM row. In particular, signs of the bit LLRs can flip (e.g., go from negative to positive, or vice versa) from one PCM row to the next.

As a results, if the signs of the bit LLRs flip (i.e., decision of the value of the soft-bit represented by the bit LLR changes) due to the processing of a given PCM row, any parity check result for a previously processed PCM row may no longer be valid as the parity check result may have changed with respect to the updated bit LLRs. Accordingly, terminating LDPC decoding just because each parity check for each PCM row returns true for a given iteration of LDPC decoding (i.e., a single processing of all of the rows of the PCM), may not ensure a proper decoding of a code word.

Therefore, certain aspects presented herein relate to confirming that, if all parity check results for all PCM rows in a given iteration of LDPC decoding return true, that no such parity check could have returned false based on any updated bit LLRs. In particular, in certain aspects, an LDPC decoder (e.g., of FIG. 8 or 9) keeps track of if the sign of any bit LLR flips during a given iteration of LDPC decoding, and if the sign of any bit LLR does flip during a given iteration of LDPC decoding, LDPC decoder determines LDPC decoding does not terminate, and another iteration of decoding is performed.

In certain aspects, the LDPC decoder only keeps track of if the sign of any bit LLR flips after bit LLRs are updated due to processing of the first PCM row. In particular, if the sign of any bit LLR flips due to processing of the first PCM row, that is not taken into account for determining whether to terminate LDPC decoding.

Further, in certain aspects, an LDPC decoder determines if, during a given iteration of LDPC decoding, for any of the PCM rows, the parity check result is false, and if so determines if the number of false parity check results are even or odd. If the number of false parity check results are odd, LDPC decoder determines LDPC decoding does not terminate, and another iteration of decoding is performed.

If, however, the number of false parity check results are even, and the sign of any bit LLR does not flip during a given iteration of LDPC decoding, LDPC decoder determines LDPC decoding terminates, and that the code word is successfully decoded to the value represented by the bit LLRs after the iteration of LDPC decoding is complete.

In some aspects, the LDPC decoder keeps track of whether the sign of any bit LLR flips during a given iteration of LDPC decoding using a single sign flip bit. Further, in certain aspects, the LDPC decoder keeps track of if the number of false parity check results are even or odd during a given iteration of LDPC coding using a single overall parity bit.

In some aspects, the LDPC decoder may utilize the sign flip bit and overall parity check bit to determine whether LDPC decoding can be terminated (i.e., is complete) for a given iteration of LDPC decoding as follows:

At the beginning of a given iteration of decoding, the sign flip bit and the overall parity bit are set to 0 (or true).

As each PCM row (layer) is processed for the iteration, the parity check result for the PCM row is added to the overall parity bit. A parity check result of true may have a value of 0. A parity check result of false may have a value of 1.

Starting from the second PCM row processed, as each PCM row is processed for the iteration, if the sign of any bit LLR flips, the sign flip bit is set to 1 (or false). Once the sign flip bit is set to 1, it cannot be reset until the start of a new iteration of decoding.

Once all PCM rows are processed for the iteration, if both the sign flip bit and the parity check result have a value of 0 (or true), the LDPC decoder determines that LDPC decoding can be terminated early. If either the sign flip bit or the parity check result have a value of 1 (or false), the LDPC decoder performs an additional iteration of decoding.

In some aspects, such as where the LDPC decoder implements a decoding scheme similar to that discussed with respect to Equations 11 to 15, the LDPC decoder may determine if the sign of any bit LLR flips during processing of a PCM row based on the old and new a posteriori LLRs calculated for the corresponding bit LLR. In particular, the bit LLR value prior to update, and the bit LLR after update are calculated as discussed based on the stored old and new a posteriori LLRs, and can be compared to see if the sign has flipped. In particular, the bit LLR value prior to update is retrieved and the difference between the old and new a posteriori LLRS are added to the bit value prior to update to determine the updated bit LLR value. Accordingly, the specific layered LDPC decoder architecture described herein, and the manner in which LLRs are stored, can be leveraged to advantageously determine if the sign of a bit LLR has been flipped, which may not be possible using some LDPC decoder architectures since both outdated and updated bit LLR values may not be accessible at the same time.

Figure 18:
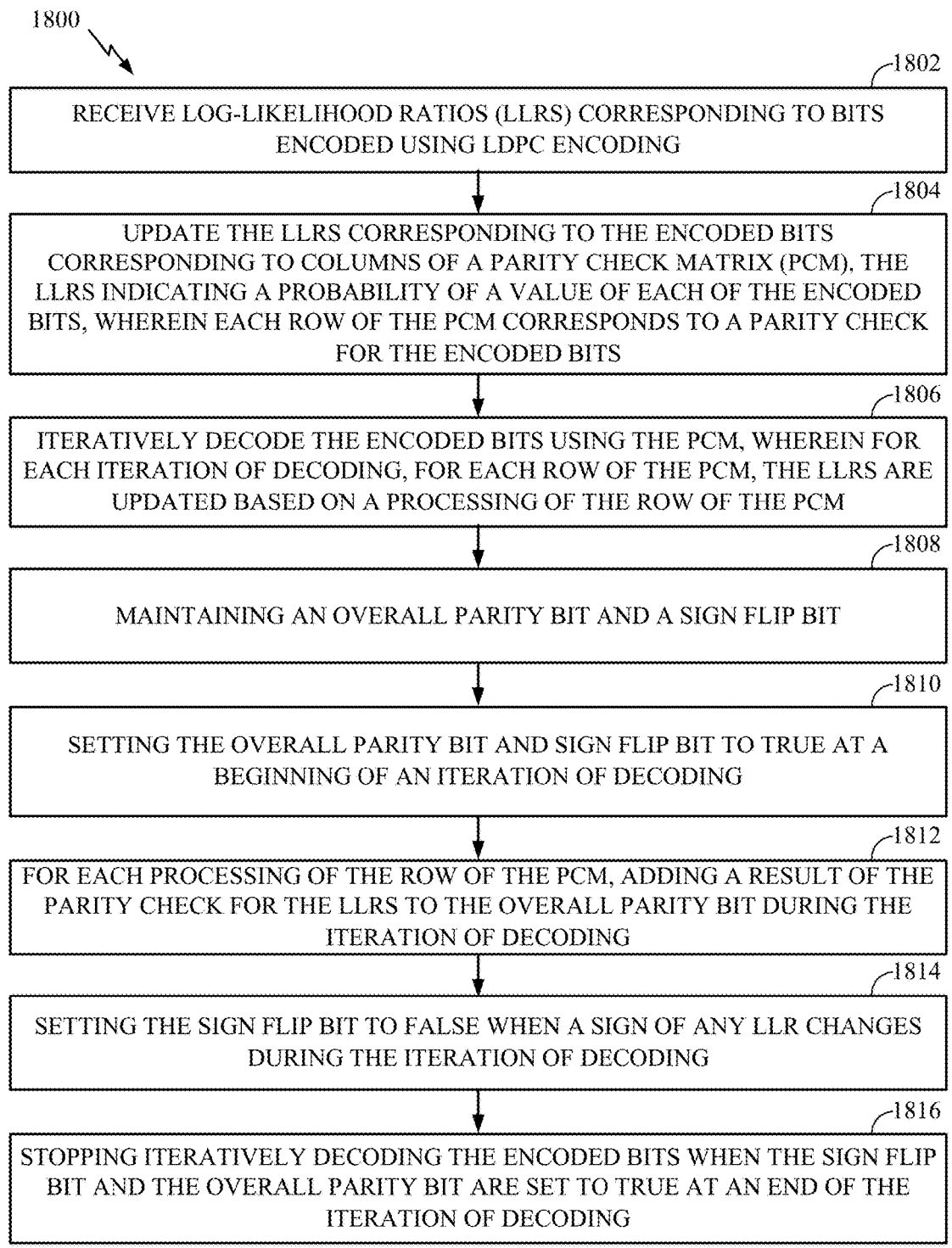
FIG. 18 is a flow diagram illustrating example operations for decoding low-density parity check (LDPC) codes, according to certain aspects of the present disclosure.

FIG. 18 illustrates example operations 1800 for wireless communications, for example, for decoding LDPC code words. According to certain aspects, operations 1800 may be performed by a decoder (e.g., decoder 800) in a wireless communications device, such as a base station (e.g., Node B 110 and/or base station 210), a user equipment (e.g., UE 116 and/or UE 250), and/or wireless device 302.

Operations 1800 begin at 1802 by receiving log-likelihood ratios (LLRs) corresponding to bits encoded using LDPC encoding. At 1804, the wireless communications device updates the LLRs corresponding to the encoded bits corresponding to columns of a parity check matrix (PCM), the LLRs indicating a probability of a value of each of the encoded bits, wherein each row of the PCM corresponds to a parity check for the encoded bits. At 1806, the wireless communications device iteratively decodes the encoded bits using the PCM, wherein for each iteration of decoding, for each row of the PCM, the LLRs are updated based on a processing of the row of the PCM. At 1808, the wireless communications device maintains an overall parity bit and a sign flip bit. At 1810, the wireless communications device sets the overall parity bit and sign flip bit to true at a beginning of an iteration of decoding. At 1812, the wireless communications device, for each processing of the row of the PCM, adds a result of the parity check for the LLRs to the overall parity bit during the iteration of decoding. At 1814, the wireless communications device sets the sign flip bit to false when a sign of any LLR changes during the iteration of decoding. At 1816, the wireless communications device stops iteratively decoding the encoded bits when the sign flip bit and the overall parity bit are set to true at an end of the iteration of decoding The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for computing, means for determining, means for utilizing (e.g., LLRs), means for updating, means for reading, and/or means for selecting may comprise a processing system including one or more processors, such as processor 230 and/or RX Data Processor 242 of the base station 210 and/or the processor 270 and/or RX Data Processor 260 of the user terminal 250. Additionally, means for storing may comprise a memory, such as the memory 232 of the base station 210 and/or the memory 272 of the user terminal 250. Further, means for receiving may comprise a receiver and/or antenna, such as the receiver 222 and/or antenna 224 of the base station 210 and/or the receiver 254 and/or antenna 252 of the user terminal 250.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for performing low-density parity-check (LDPC) decoding, the method comprising:
receiving log-likelihood ratios (LLRs) corresponding to bits encoded using LDPC encoding;
updating the LLRs corresponding to the encoded bits corresponding to columns of a parity check matrix (PCM), the LLRs indicating a probability of a value of each of the encoded bits, wherein each row of the PCM corresponds to a parity check for the encoded bits;
iteratively decoding the encoded bits using the PCM, wherein for each iteration of decoding, for each row of the PCM, the LLRs are updated based on a processing of the row of the PCM;
maintaining an overall parity bit;
setting the overall parity bit to true at a beginning of an iteration of decoding;

for each processing of the row of the PCM, adding a result of the parity check for the LLRs to the overall parity bit during the iteration of decoding;

maintaining a sign flip bit;

setting the sign flip bit to true at the beginning of the iteration of decoding;

setting the sign flip bit to false when a sign of any LLR changes during the iteration of decoding; and stopping iteratively decoding the encoded bits when the sign flip bit and the overall parity bit are set to true at an end of the iteration of decoding.

2. The method of claim 1, wherein iteratively decoding the encoded bits comprises utilizing a layered LDPC decoding technique.

3. The method of claim 1, further comprising determining if a sign of any LLR changes based on a corresponding outdated a posteriori LLR and a corresponding updated a posteriori LLR.

4. The method of claim 3, wherein processing of the row of the PCM comprises determining for each of the encoded bits an a posteriori LLR for the row of the PCM, wherein for a first set of the encoded bits, determining the a posteriori LLR comprises using a first number of outdated LLRs, and wherein for a second set of the encoded bits, determining the a posteriori LLR comprises using a second number of updated bit LLRs, wherein the first set of the encoded bits and the second set of the encoded bits comprise all of the encoded bits.

5. The method of claim 1, wherein setting the sign flip bit to false when a sign of any LLR changes during the iteration of decoding comprises setting the sign flip bit to false when a sign of any LLR changes after processing of a first row of the PCM during the iteration.

6. An apparatus for performing low-density parity-check (LDPC) decoding, the apparatus comprising:

a memory; and a processor, the memory and processor being configured to:

receive log-likelihood ratios (LLRs) corresponding to bits encoded using LDPC encoding;

update the LLRs corresponding to the encoded bits corresponding to columns of a parity check matrix (PCM), the LLRs indicating a probability of a value of each of the encoded bits, wherein each row of the PCM corresponds to a parity check for the encoded bits;

iteratively decode the encoded bits using the PCM, wherein for each iteration of decoding, for each row of the PCM, the LLRs are updated based on a processing of the row of the PCM;

maintain an overall parity bit;

set the overall parity bit to true at a beginning of an iteration of decoding;

for each processing of the row of the PCM, add a result of the parity check for the LLRs to the overall parity bit during the iteration of decoding;

maintain a sign flip bit;

set the sign flip bit to true at the beginning of the iteration of decoding;

set the sign flip bit to false when a sign of any LLR changes during the iteration of decoding; and stop iteratively decoding the encoded bits when the sign flip bit and the overall parity bit are set to true at an end of the iteration of decoding.

7. The apparatus of claim 6, wherein the memory and processor being configured to iteratively decode the encoded bits comprises the memory and processor being configured to utilize a layered LDPC decoding technique.

8. The apparatus of claim 6, wherein the memory and processor are further configured to determine if a sign of any LLR changes based on a corresponding outdated a posteriori LLR and a corresponding updated a posteriori LLR.

9. The apparatus of claim 8, wherein processing of the row of the PCM comprises determining for each of the encoded bits an a posteriori LLR for the row of the PCM, wherein for a first set of the encoded bits, determining the a posteriori LLR comprises using a first number of outdated LLRs, and wherein for a second set of the encoded bits, determining the a posteriori LLR comprises using a second number of updated bit LLRs, wherein the first set of the encoded bits and the second set of the encoded bits comprise all of the encoded bits.

10. The apparatus of claim 6, wherein the memory and processor being configured to set the sign flip bit to false when a sign of any LLR changes during the iteration of decoding comprises the memory and processor being configured to set the sign flip bit to false when a sign of any LLR changes after processing of a first row of the PCM during the iteration.

11. A non-transitory computer readable medium having instructions stored thereon that when executed by an apparatus cause the apparatus to perform a method for performing low-density parity-check (LDPC) decoding, the method comprising:

receiving log-likelihood ratios (LLRs) corresponding to bits encoded using LDPC encoding;

updating the LLRs corresponding to the encoded bits corresponding to columns of a parity check matrix (PCM), the LLRs indicating a probability of a value of each of the encoded bits, wherein each row of the PCM corresponds to a parity check for the encoded bits;

iteratively decoding the encoded bits using the PCM, wherein for each iteration of decoding, for each row of the PCM, the LLRs are updated based on a processing of the row of the PCM;

maintaining an overall parity bit;

setting the overall parity bit to true at a beginning of an iteration of decoding;

for each processing of the row of the PCM, adding a result of the parity check for the LLRs to the overall parity bit during the iteration of decoding;

maintaining a sign flip bit;

setting the sign flip bit to true at the beginning of the iteration of decoding;

setting the sign flip bit to false when a sign of any LLR changes during the iteration of decoding; and stopping iteratively decoding the encoded bits when the sign flip bit and the overall parity bit are set to true at an end of the iteration of decoding.

12. The non-transitory computer readable medium of claim 11, wherein iteratively decoding the encoded bits comprises utilizing a layered LDPC decoding technique.

13. The non-transitory computer readable medium of claim 11, wherein the method further comprises determining if a sign of any LLR changes based on a corresponding outdated a posteriori LLR and a corresponding updated a posteriori LLR.

14. The non-transitory computer readable medium of claim 13, wherein processing of the row of the PCM comprises determining for each of the encoded bits an a posteriori LLR for the row of the PCM, wherein for a first set of the encoded bits, determining the a posteriori LLR comprises using a first number of outdated LLRs, and wherein for a second set of the encoded bits, determining the a posteriori LLR comprises using a second number of updated bit LLRs, wherein the first set of the encoded bits and the second set of the encoded bits comprise all of the encoded bits.

15. The non-transitory computer readable medium of claim 11, wherein setting the sign flip bit to false when a sign of any LLR changes during the iteration of decoding comprises setting the sign flip bit to false when a sign of any LLR changes after processing of a first row of the PCM during the iteration.

16. An apparatus for performing low-density parity-check (LDPC) decoding, the apparatus comprising:
- means for receiving log-likelihood ratios (LLRs) corresponding to bits encoded using LDPC encoding;
- means for updating the LLRs corresponding to the encoded bits corresponding to columns of a parity check matrix (PCM), the LLRs indicating a probability of a value of each of the encoded bits, wherein each row of the PCM corresponds to a parity check for the encoded bits;
- means for iteratively decoding the encoded bits using the PCM, wherein for each iteration of decoding, for each row of the PCM, the LLRs are updated based on a processing of the row of the PCM;
- means for maintaining an overall parity bit;
- means for setting the overall parity bit to true at a beginning of an iteration of decoding;
- means for, for each processing of the row of the PCM, adding a result of the parity check for the LLRs to the overall parity bit during the iteration of decoding;
- means for maintaining a sign flip bit;
- means for setting the sign flip bit to true at the beginning of the iteration of decoding;
- means for setting the sign flip bit to false when a sign of any LLR changes during the iteration of decoding; and
- means for stopping iteratively decoding the encoded bits when the sign flip bit and the overall parity bit are set to true at an end of the iteration of decoding.

17. The apparatus of claim 16, wherein iteratively means for decoding the encoded bits comprises means for utilizing a layered LDPC decoding technique.

18. The apparatus of claim 16, further comprising means for determining if a sign of any LLR changes based on a corresponding outdated a posteriori LLR and a corresponding updated a posteriori LLR.

19. The apparatus of claim 18, wherein processing of the row of the PCM comprises determining for each of the encoded bits an a posteriori LLR for the row of the PCM, wherein for a first set of the encoded bits, determining the a posteriori LLR comprises using a first number of outdated LLRs, and wherein for a second set of the encoded bits, determining the a posteriori LLR comprises using a second number of updated bit LLRs, wherein the first set of the encoded bits and the second set of the encoded bits comprise all of the encoded bits.

20. The apparatus of claim 16, wherein means for setting the sign flip bit to false when a sign of any LLR changes during the iteration of decoding comprises means for setting the sign flip bit to false when a sign of any LLR changes after processing of a first row of the PCM during the iteration.

* * * * *